(12) United States Patent
Zhang et al.

(10) Patent No.: US 12,137,622 B2
(45) Date of Patent: Nov. 5, 2024

(54) FORMING-FREE RANDOM-ACCESS MEMORY (RRAM) DEVICES

(71) Applicant: TetraMem Inc., Fremont, CA (US)

(72) Inventors: Minxian Zhang, Amherst, MA (US); Mingche Wu, San Jose, CA (US); Ning Ge, Danville, CA (US)

(73) Assignee: TetraMem Inc., Fremont, CA (US)

( * ) Notice: Subject to any disclaimer, the term of this patent is extended or adjusted under 35 U.S.C. 154(b) by 68 days.

(21) Appl. No.: 17/812,866

(22) Filed: Jul. 15, 2022

(65) Prior Publication Data
US 2024/0023466 A1     Jan. 18, 2024

(51) Int. Cl.
| | | |
|---|---|---|
| *H10N 70/00* | (2023.01) | |
| *G11C 13/00* | (2006.01) | |
| *H10N 70/20* | (2023.01) | |

(52) U.S. Cl.
CPC ....... *H10N 70/841* (2023.02); *G11C 13/0007* (2013.01); *G11C 13/004* (2013.01); *G11C 13/0069* (2013.01); *H10N 70/041* (2023.02); *H10N 70/24* (2023.02); *H10N 70/826* (2023.02); *H10N 70/8833* (2023.02)

(58) Field of Classification Search
CPC .... H10N 70/841; H10N 70/041; H10N 70/24; H10N 70/826; H10N 70/8833; G11C 13/0007; G11C 13/004; G11C 13/0069; G11C 2213/15; G11C 2213/79; G11C 2213/82; G11C 13/003; G11C 2013/0083; H10B 63/80
See application file for complete search history.

(56) References Cited

U.S. PATENT DOCUMENTS

| | | |
|---|---|---|
| 5,953,633 A | 9/1999 | Chen et al. |
| 8,921,853 B2 | 12/2014 | Yamazaki |
| 9,053,781 B2 * | 6/2015 | Tsai ............... H10N 70/826 |
| 9,178,153 B2 * | 11/2015 | Zhang ............. H10N 70/046 |
| 10,535,818 B2 * | 1/2020 | Ha ................. H10N 70/24 |
| 2008/0165572 A1 | 7/2008 | Lung |

(Continued)

OTHER PUBLICATIONS

International Searching Authority (ISA)/US, International Search Report and Written Opinion for PCT/US23/70330, mailed Nov. 16, 2023, 10 pages.

*Primary Examiner* — Allison Bernstein
(74) *Attorney, Agent, or Firm* — Jaffery Watson Hamilton & DeSanctis LLP

(57) ABSTRACT

A method for fabricating a forming-free resistive random-access memory (RRAM) device is provided. The method includes: fabricating an RRAM cell and annealing the RRAM cell. The RRAM cell includes: a bottom electrode, a switching oxide layer comprising at least one transition metal oxide; a top electrode, and an interface between the switching oxide layer and the top electrode. In some embodiments, the at least one transition metal oxide includes at least one of $HfO_x$ or $TaO_y$, wherein $x \le 2.0$, and wherein $y \le 2.5$. The interface layer comprises a layer of at least one of $Al_2O_3$, $MgO$, $Y_2O_3$, or $La_2O_3$. The forming-free RRAM device may be switched to multiple resistance levels without a forming process.

13 Claims, 31 Drawing Sheets

(56) References Cited

U.S. PATENT DOCUMENTS

| | | |
|---|---|---|
| 2013/0334486 A1 | 12/2013 | Tsai et al. |
| 2014/0192586 A1 | 7/2014 | Nardi et al. |
| 2015/0034898 A1 | 2/2015 | Wang et al. |
| 2016/0276411 A1 | 9/2016 | Tour et al. |
| 2016/0293666 A1 | 10/2016 | Huang et al. |
| 2022/0077389 A1* | 3/2022 | Zhang .................. H10N 70/011 |

* cited by examiner

PRIOR ART

PRIOR ART

200d

PRIOR ART

200f

500A

600A

911

913

915

921

923

925

931

933

935

941

943

945

951

953

963

965

1000

FORMING-FREE RANDOM-ACCESS MEMORY (RRAM) DEVICES

TECHNICAL FIELD

The implementations of the disclosure relate generally to resistive random-access memory (RRAM) devices and, more specifically, to forming-free RRAM devices and methods for fabricating and operating the same.

BACKGROUND

A resistive random-access memory (RRAM) device is a two-terminal passive device with tunable and non-volatile resistance. The resistance of the RRAM device may be electrically switched between a high-resistance state (HRS) and a low-resistance state (LRS) by applying suitable programming signals to the RRAM device. RRAM devices may be used to form crossbar arrays that may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, methods for fabricating a forming-free resistive random-access memory (RRAM) device is provided. The methods include fabricating an RRAM cell with designed interface layer and annealing the RRAM cell.

In some embodiments, fabricating the RRAM cell includes: fabricating, on a bottom electrode, a switching oxide layer including at least one transition metal oxide; fabricating, on the switching oxide layer, an interface layer including a material that is more chemically stable than the at least one transition metal oxide; and fabricating a top electrode on the interface layer.

In some embodiments, the RRAM cell is annealed in a forming gas environment including $N_2$ and $H_2$.

In some embodiments, the RRAM cell is annealed at an annealing temperature between about 350° C. and 450° C.

In some embodiments, the methods further include fabricating, on the RRAM cell, one or more interconnect layers, where the RRAM cell is annealed with the one or more interconnect layers.

In some embodiments, fabricating the one or more interconnect layers includes fabricating, on the top electrode of the RRAM cell, a metal pad or a metal via of the one or more interconnect layers.

In some embodiments, the RRAM and the one or more interconnect layers are annealed in a plurality of annealing processes. The RRAM cell and the one or more interconnect layers are annealed in a forming gas at a temperature between about 350° C. and 450° C. in each of the plurality of annealing processes.

In some embodiments, a thickness of the interface layer is determined based on a device size of the RRAM cell and thermal budgets related to the annealing. The interface layer is configured to reduce diffusion and reaction between the top electrode and the switching oxide layer.

According to one or more aspects of the present disclosure, a forming-free resistive random-access memory (RRAM) device is provided. The forming-free RRAM device includes: a bottom electrode; a switching oxide layer including at least one transition metal oxide; a top electrode; and an interface layer fabricated between the top electrode and the switching oxide layer. The interface layer includes a material that is more chemically stable than the at least one transition metal oxide. The forming-free RRAM device is configured to be switched to a plurality of resistances without a forming process that generates a conductive filament in the switching oxide layer.

In some embodiments, the at least one transition metal oxide includes at least one of $HfO_x$ or $TaO_y$, wherein $x \leq 2.0$, and wherein $y \leq 2.5$.

In some embodiments, wherein the interface layer includes a layer of at least one of $Al_2O_3$, $MgO$, $Y_2O_3$, or $La_2O_3$.

In some embodiments, a thickness of the interface layer is between 0.2 nm and 1 nm.

In some embodiments, a thickness of the interface layer is greater than 1 nm.

In some embodiments, a virgin resistance of the forming-free RRAM device is between 1 k$\Omega$ and 1 M$\Omega$.

According to one or more aspects of the present disclosure, methods for operating forming-free RRAM devices are provided. The methods include: performing a first read operation on a first forming-free RRAM device in a virgin state to determine a first virgin resistance of the first RRAM device; and performing a first reset operation on the first forming-free RRAM device to switch the first forming-free RRAM device from the first virgin resistance to a first target resistance. The first target resistance is greater than the first virgin resistance. The first read operation and the first reset operation are performed without previously forming a conductive filament in the first forming-free RRAM device in a forming process.

In some embodiments, a first reset current through the first forming-free RRAM device during the first reset operation is not greater than 500 μA.

In some embodiments, the methods for operating forming-free RRAM devices further include performing a first set operation on the first forming-free RRAM device to switch the first forming-free RRAM device from the first target resistance to a second target resistance. In some embodiments, performing the first set operation includes applying a first set voltage to the first forming-free RRAM device, where the first set voltage is not greater than 1.0 V.

In some embodiments, performing the first reset operation on the first forming-free RRAM device includes applying a first reset voltage to the first forming-free RRAM device, where the first set voltage and the first reset voltage are of opposite polarity.

In some embodiments, the methods for operating forming-free RRAM devices further include: performing a second read operation on a second forming-free RRAM device to determine a second virgin resistance of the second forming-free RRAM device; and performing a second set operation on the second forming-free RRAM device to switch the second forming-free RRAM device from the second virgin resistance to a third target resistance, where the third target resistance is smaller than the second virgin resistance. The second read operation and the second set operation are performed without previously forming a conductive filament in the second forming-free RRAM device in a forming process.

In some embodiments, the methods for operating forming-free RRAM devices further include: applying a second reset voltage to the second forming-free RRAM device to switch the second forming-free RRAM device from the third target resistance to a fourth target resistance. In some embodiments, performing the second set operation on the second forming-free RRAM device includes applying a second set voltage to the second forming-free RRAM device, where the second reset voltage and the second set voltage are of opposite polarity.

In some embodiments, a second reset current through the second forming-free RRAM device in response to the second reset voltage is not greater than 500 µA. The second reset voltage is not greater than 1.0 V.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1A:
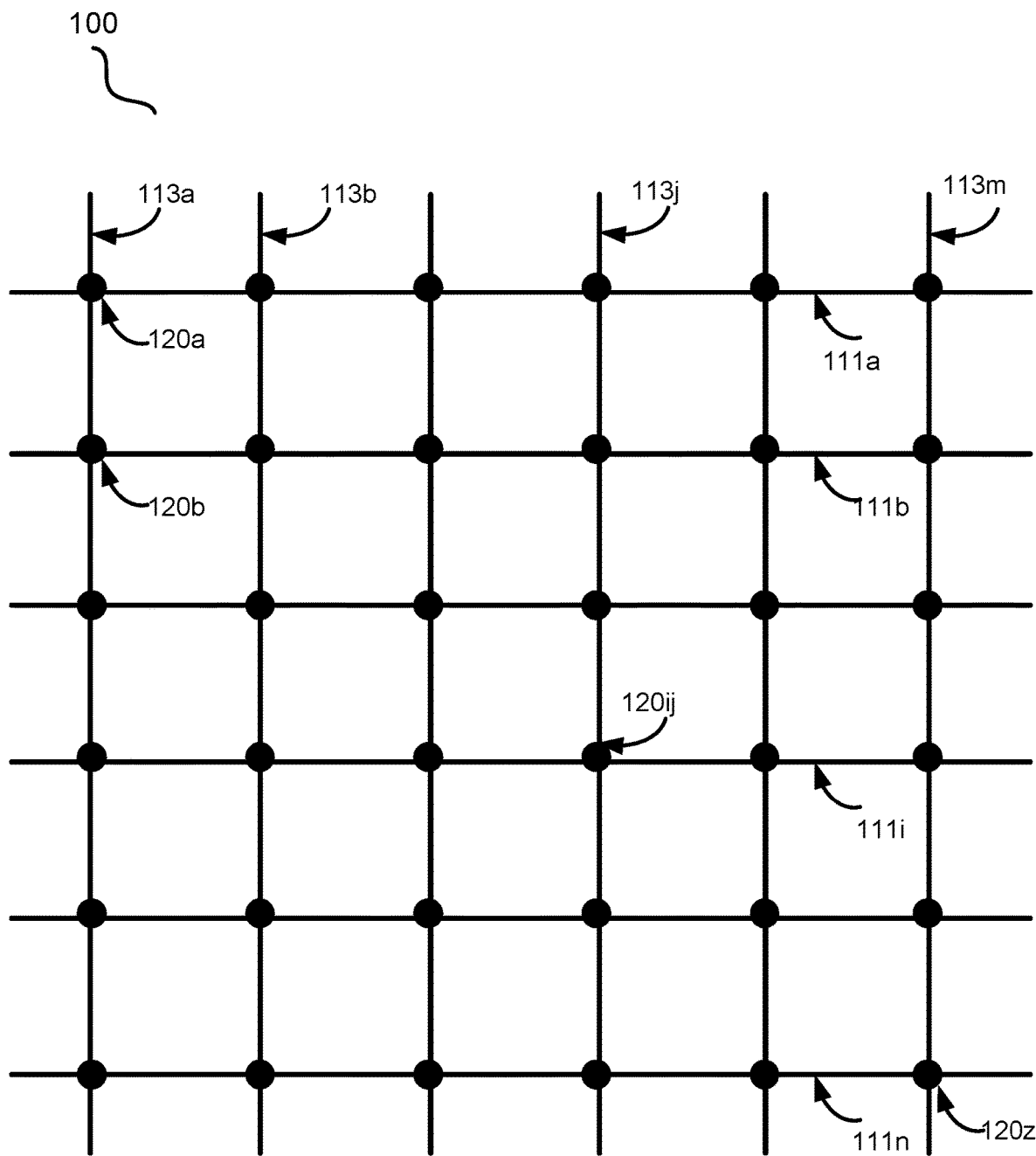
FIG. 1A is a schematic diagram illustrating an example of a crossbar circuit in accordance with some embodiments of the present disclosure.

Aspects of the disclosure provide forming-free resistive random-access memory (RRAM) devices and methods for fabricating and operating the forming-free RRAM devices.

An RRAM device is a two-terminal passive device with programmable resistance. The RRAM device may include a bottom electrode, a top electrode, and a switching oxide layer positioned between the bottom electrode and the top electrode. The bottom electrode may include a non-reactive metal, such as platinum (Pt), palladium (Pd), etc. The top electrode may include a reactive metal, such as tantalum (Ta), titanium (Ti), etc. The switching oxide layer may include a transition metal oxide, such as hafnium oxide ($HfO_x$) or tantalum oxide ($TaO_x$).

A conventional RRAM device behaves as an insulator in its virgin state (i.e., before it is subject to a suitable stimulation after fabrication). The conventional RRAM device may be transitioned into a conductive state through a forming process that involves applying a high forming voltage (e.g., a voltage of 1.7 V) to the conventional RRAM device. During the forming process, a conductive filament is formed in the conventional RRAM device. The RRAM device can then be switched between two resistance states, i.e., a high-resistance state (HRS) and a lower resistance state (LRS), in response to suitable programming signals (e.g., voltage or current signals). A switching event that programs the RRAM device from the HRS is referred to as a set process. A switching event that programs the RRAM device from the LRS is referred to as a reset process. In a crossbar array circuit including RRAM arrays, the programming signals may be provided to the designated RRAM device via a selector, such as a transistor.

Since the forming process involves an initial breakdown of the metal oxide in the switching oxide layer, the formation of the initial conductive filament in the forming process is an abrupt process and requires a high forming voltage (e.g., a voltage of 1.7 V). In some embodiments, the forming voltage may be higher than 2 V to 3 V to form an RRAM device with a thicker switching oxide layer. As it is difficult to control the dimensions of the filament formed in the forming process, the forming process typically does not result in a desirable device resistance. The conventional RRAM device may need to be tuned in a subsequent reset process (also referred to as the "initial reset process") to achieve the desirable device resistance. A high reset current is required to rupture the conductive filament in the initial reset process. As a result, the conventional RRAM device operates at high currents (e.g., a current higher than 1 mA), which leads to high power consumption and requires a relatively large transistor that can provide such high operation current. The forming process is also time consuming. For example, it may take a few minutes to form a 256×256 RRAM array, resulting in a time-consuming process for forming a crossbar circuit including multiple 256×256 RRAM arrays. Furthermore, the formation of the initial filament in the forming process and the rupture of the initial filament in the initial reset process are abrupt, which may cause device-to-device performance variations.

Accordingly, the present disclosure provides for forming-free RRAMs and methods for marking and operating the same. Unlike the conventional RRAMs that require a forming process to be conductive, a forming-free RRAM device as described herein is conductive in its virgin state and requires no formation of a filament to operate. The forming-free RRAM device has a medium to low resistance in its virgin state that may be read to determine suitable programming parameters for a subsequent operation (e.g., a set operation, a reset operation, etc.).

In some embodiments, the forming-free RRAM device may include an RRAM cell including a bottom electrode, a top electrode, a switching oxide layer fabricated between the bottom electrode and the top electrode, and an interface layer fabricated between the switching oxide layer and the top electrode. The switching oxide layer may include one or more transition metal oxides, such as hafnium oxide, tantalum oxide, etc. The interface layer may include one or more layers of a metal oxide that is more chemically stable than the transition metal oxide, such as aluminum oxide. The metal oxide in the interface layer does not react with the top electrode or the switching oxide. The interface layer may thus control the reaction and diffusion between the top electrode and the switching oxide layer. The interface layer may include one or more continuous or non-continuous layers of aluminum oxide.

The RRAM cell may be annealed to achieve forming-free behavior. For example, the RRAM cell may be annealed in one or more annealing processes, each of which involves annealing the RRAM cell in a forming gas environment (e.g., a mixture of $N_2$ and $H_2$) at annealing temperatures between 350 and 450° C. for a suitable period of time (e.g., 15-30 minutes). The annealing may enhance the diffusion and reaction between the top electrode and the switching oxide, while the interface layer may reduce the diffusion and reaction between the top electrode and the switching oxide layer. The interface layer and the annealing conditions (e.g., temperatures, annealing time, etc.) may be optimized in view of the device size (e.g., the critical dimension) of the RRAM device to achieve a desirable virgin resistance of the RRAM device.

The resistance of the forming-free RRAM device may be programmed to multiple levels without a forming process. For example, to program the forming-free RRAM device to a target resistance, a read operation may be performed on the forming-free RRAM device to determine the virgin resistance of the forming-free RRAM device. In some embodiments in which the virgin resistance is greater than the target resistance, the forming-free RRAM device may be programmed to the target resistance by applying a set voltage (e.g., a voltage of 0.6 V) to the forming-free RRAM device without previously performing a forming process. In some embodiments in which the target resistance is greater than the virgin resistance of the forming-free RRAM device, the forming-free RRAM device may be programmed to the target resistance by applying a reset voltage to the forming-free RRAM device. The reset current through the RRAM device may be lower than 200 μA. The reset is performed without previously performing either a forming process or an initial set process on the RRAM device. The set voltage and the reset voltage may be of opposite polarity (e.g., a positive polarity and a negative polarity). The forming-free RRAM device may be switched between a high-resistance state and a low-resistance state in response to ultra-low set voltages (e.g., voltages lower than 1 V) and reset current (e.g., reset peak current lower than 200 μA).

Accordingly, the present disclosure provides mechanisms for fabricating and operating forming-free RRAM devices. By balancing the material factors (e.g., the thickness of the interface layer) and the annealing factors (e.g., the annealing conditions), the mechanisms described herein provide for forming-free RRAM devices with desirable characteristics, such as low-energy switching, low device-to-device performance variations, ultra-low operation current and voltage, bipolar switching with a large Ion/Ioff ratio, multilevel analog resistive switching, etc. The forming-free RRAM devices disclosed herein may enhance the scalability of a crossbar array of RRAM devices and may enable high-density memory and/or computing applications with low power consumption.

FIG. 1A is a schematic diagram illustrating an example 100 of a crossbar circuit in accordance with some embodiments of the present disclosure. As shown, crossbar circuit 100 may include a plurality of interconnecting electrically conductive wires, such as one or more row wires 111a, 111b, . . . , 111i, . . . , 111n, and column wires 113a, 113b, . . . , 113j, . . . , 113m for an n-row by m-column crossbar array. The crossbar circuit 100 may further include cross-point devices 120a, 120b, . . . , 120z, etc. Each of the cross-point devices may connect a row wire and a column wire. For example, the cross-point device 120ij may connect the row wire 111i and the column wire 113j. In some embodiments, crossbar circuit 100 may further include digital-to-analog converters (DAC, not shown), analog-to-digital converters (ADC, not shown), switches (not shown), and/or any other suitable circuit components for implementing a crossbar-based apparatus. The number of the column wires 113a-m and the number of the row wires 111a-n may or may not be the same.

Row wires 111 may include a first row wire 111a, a second row wire 111b, . . . , 111i, . . . , and an n-th row wire 1/1n. Each of row wires 111a, . . . , 111n may be and/or include any suitable electrically conductive material. In some embodiments, each row wire 111a-n may be a metal wire.

Column wires 113 may include a first column wire 113a, a second column wire 113b, . . . , and an m-th column wire 113m. Each of column wires 113a-m may be and/or include any suitable electrically conductive material. In some embodiments, each column wire 113a-m may be a metal wire.

Each cross-point device 120 may be and/or include any suitable device with tunable resistance, such as a memristor, phase-change memory (PCM) devices, floating gates, spintronic devices, resistive random-access memory (RRAM), static random-access memory (SRAM), etc. In some embodiments, one or more of cross-point devices 120 may include an RRAM device as described in connection with FIGS. 3-11.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance and generates a current from the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is outputted via each column wire and may be accumulated according to Kirchhoff's current law. This may enable in-memory computing (IMC) via parallel multiplications and summations performed in the crossbar arrays.

Figure 1B:
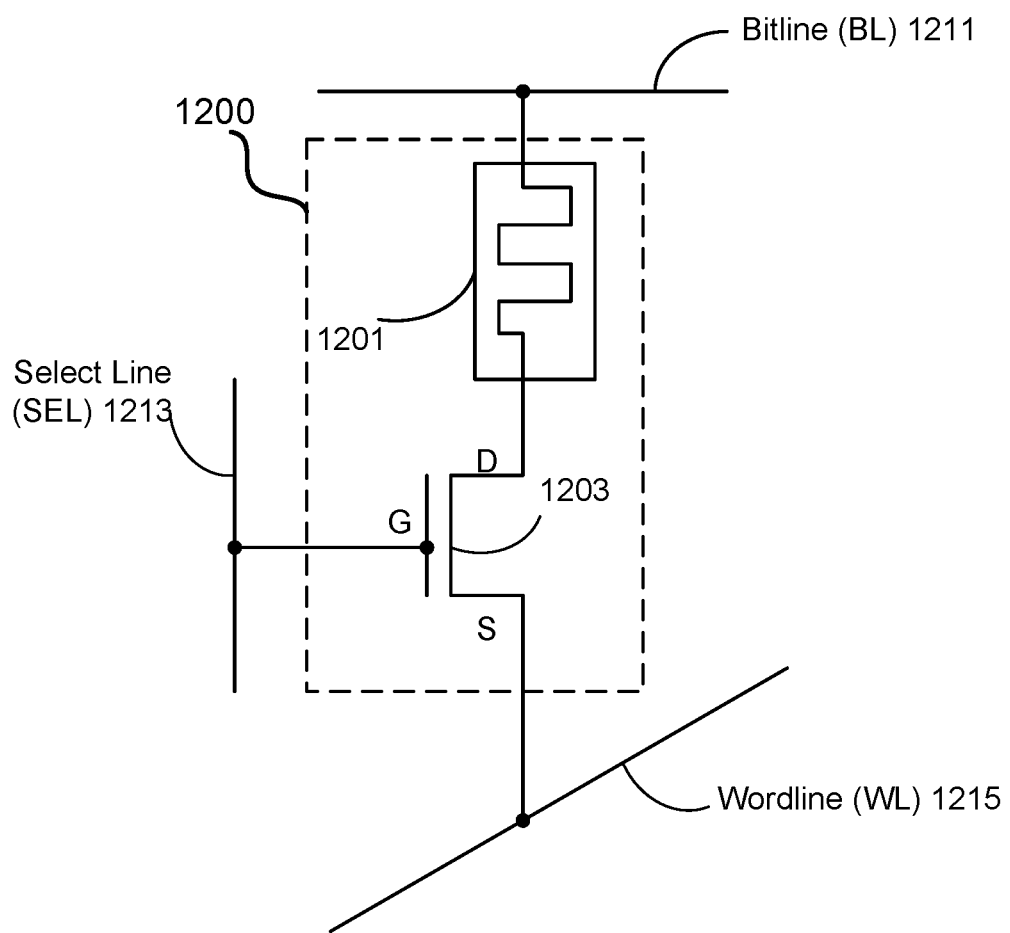
FIG. 1B is a schematic diagram illustrating an example of a cross-point device in accordance with some embodiments of the present disclosure.

FIG. 1B is a schematic diagram illustrating an example 1200 of a cross-point device in accordance with some embodiments of the present disclosure. As shown, cross-point device 1200 may connect a bitline (BL) 1211, a select line (SEL) 1213, and a wordline (WL) 1215. The bitline 1211 and the wordline 1215 may be a column wire and a row wire as described in connection with FIG. 1A, respectively.

Cross-point device 1200 may include an RRAM device 1201 and a transistor 1203. A transistor is a three-terminal device, which may be marked as gate (G), source (S), and drain (D), respectively. The transistor 1203 may be serially connected to RRAM device 1201. As shown in FIG. 1B, the bottom electrode of the RRAM device 1201 may be connected to the drain of transistor 1203. The top electrode of the RRAM device 1201 may be connected to the bitline 1211. The source of the transistor 1203 may be connected to the wordline 1215. The gate of the transistor 1203 may be connected to the select line 1213. RRAM device 1201 may include one or more RRAM devices as described in connection with FIGS. 2A-5M below. Cross-point device 1200 may also be referred to as a 1-transistor-1-resistor (1T1R) configuration. The transistor 1203 may perform as a selector as well as a current controller, which may set the current compliance to the RRAM device 1201 during programming. The gate voltage on transistor 1203 can set current compliances to cross-point device 1200 during programming and can thus control the conductance and analog behavior of cross-point device 1200. For example, when cross-point device 1200 is set from a high-resistance state to a low-resistance state, a set signal (e.g., a voltage signal, a current signal) may be provided via the bitline (BL) 1211. Another voltage, also referred as a select voltage or gate voltage, may be applied via the select line (SEL) 1213 to the transistor gate to open the gate and set the current compliance, while the wordline (WL) 1215 may be set to ground. When cross-point device 1200 is reset from the low-resistance state to the high-resistance state, a gate voltage may be applied to the gate of the transistor 1203 via the select line 1213 to open the transistor gate. Meanwhile, a reset signal may be sent to the RRAM device 1201 via the wordline 1215, while the bitline 1211 may be set to ground.

Figure 2A:
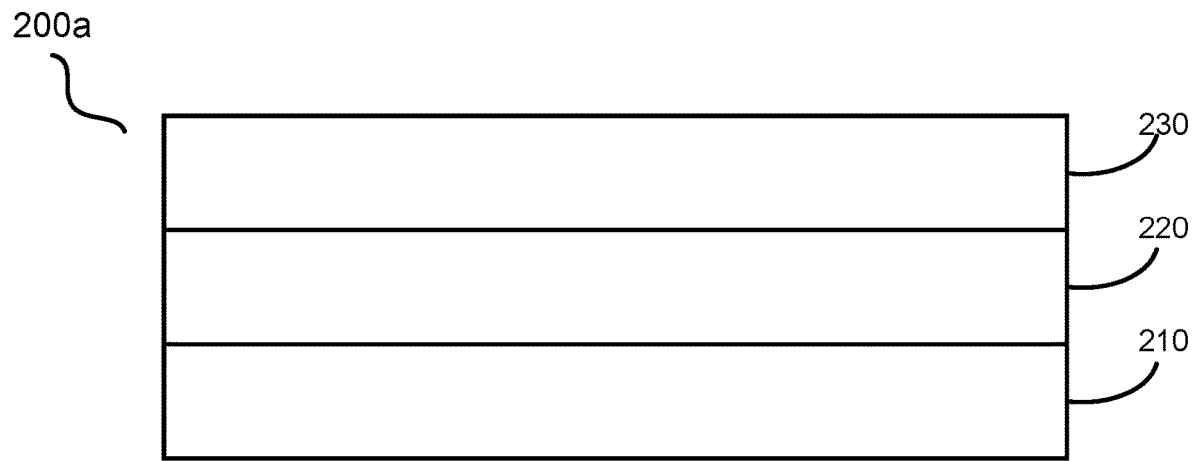
FIGS. 2A, 2B, and 2C illustrate cross-sectional views of a conventional RRAM device that requires a forming process to operate.
Figure 2B:
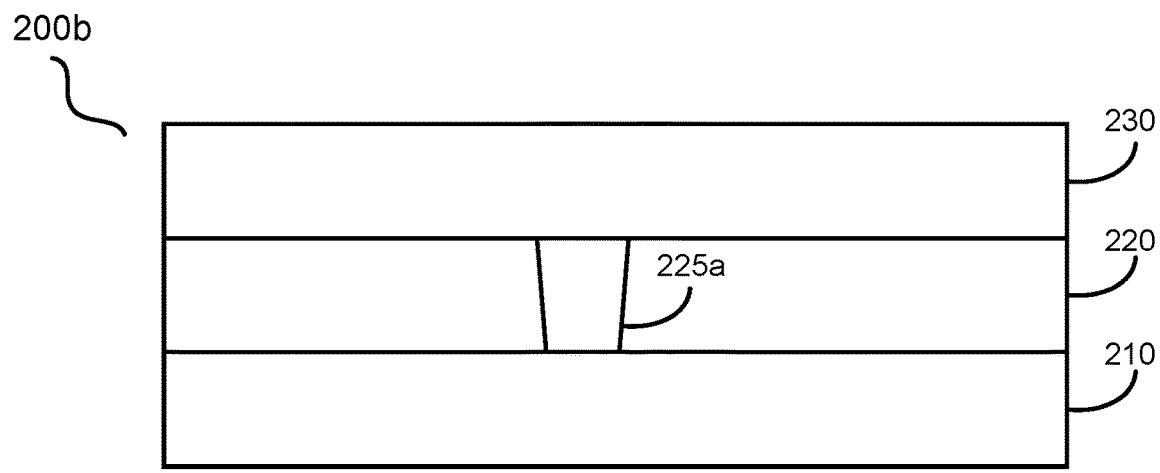
Figure 2C:
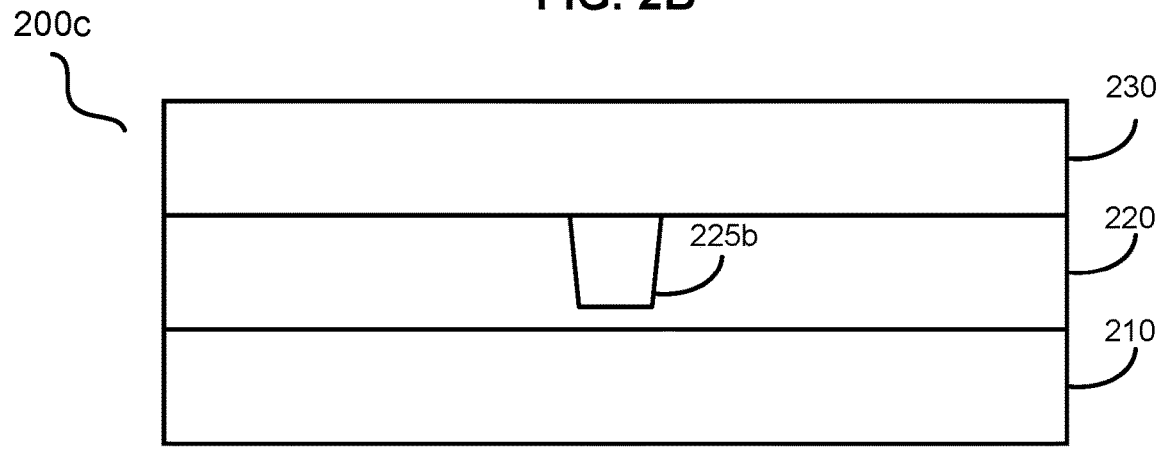

FIGS. 2A, 2B, and 2C illustrate cross-sectional views of a conventional RRAM device that requires a forming process to operate. RRAM devices 200a, 200b, and 200c may correspond to an RRAM device in an initial state, a low-resistance state, and a high-resistance state, respectively.

As shown in FIG. 2A, RRAM device 200a may include a bottom electrode 210, a switching oxide layer 220, and a top electrode 230. Bottom electrode 210 may include a suitable material that is electronically conductive and non-reactive to the switching oxide, such as Pt, Pd, etc. Switching oxide layer 220 may include one or more transition metal oxides, such as $TaO_x$, $HfO_x$, $TiO_x$, $NbO_x$, $ZrO_x$, etc., in binary oxides, ternary oxides, and high order oxides. In some embodiments, the chemical stability of the non-reactive material in bottom electrode 210 may be higher than that of the transition metal oxide(s) in switching oxide layer 220. Top electrode 230 may include any suitable metallic material that are electronically conductive and reactive to the switching oxide. For example, the metallic material in top electrode 230 may include Ta, Hf, Ti, etc.

RRAM device 200a may have a high virgin resistance (e.g., a few giga-ohms or GΩ) and may thus be regarded as an insulator in its virgin state. The virgin resistance of RRAM device 200a may be changed and RRAM device 200a may be switched to a state of a lower resistance via a forming process. For example, a forming voltage may be applied to RRAM device 200a. The application of the voltage to RRAM device 200a may induce the metallic material(s) in the top electrode to absorb oxygen from the switching oxide layer 220 and create oxygen vacancies in the switching oxide layer 220. As a result, a conductive path (e.g., a filament) that is oxygen vacancy rich may form in the switching oxide layer 220. For example, as illustrated in FIG. 2B, a conductive filament 225a may be formed in the switching oxide layer 220. As shown, conductive filament 225a may be formed from top electrode 230 to bottom electrode 210 across switching oxide layer 220. RRAM device 200b may be reset to a high-resistance state. For example, a reset signal (e.g., a voltage signal or a current signal) may be applied to RRAM device 200b during a reset process. In some embodiments, the set signal and the reset signal may have opposite polarity, i.e., a positive signal and a negative signal, respectively. The application of the reset signal may cause oxygen to drift back to the switching oxide layer 220 and recombine with one or more of the oxygen vacancies. For example, an interrupted conductive filament 225b as shown in FIG. 2C may be formed in the switching oxide layer 220 during the reset process. As shown, the conductive filament may be interrupted with an oxide gap between the interrupted conductive filament 225b and the bottom electrode 210. The lateral dimension of conductive filament 225b may be smaller than that of the conductive filament 225a. Conductive filament 225b does not continuously connect the bottom electrode 210 and the top electrode 230. RRAM device 200b-c may be electrically switched between the high-resistance state and the low-resistance state by applying suitable programming signals (e.g., voltage signals, current signals, etc.) to the RRAM device.

Figure 2D:
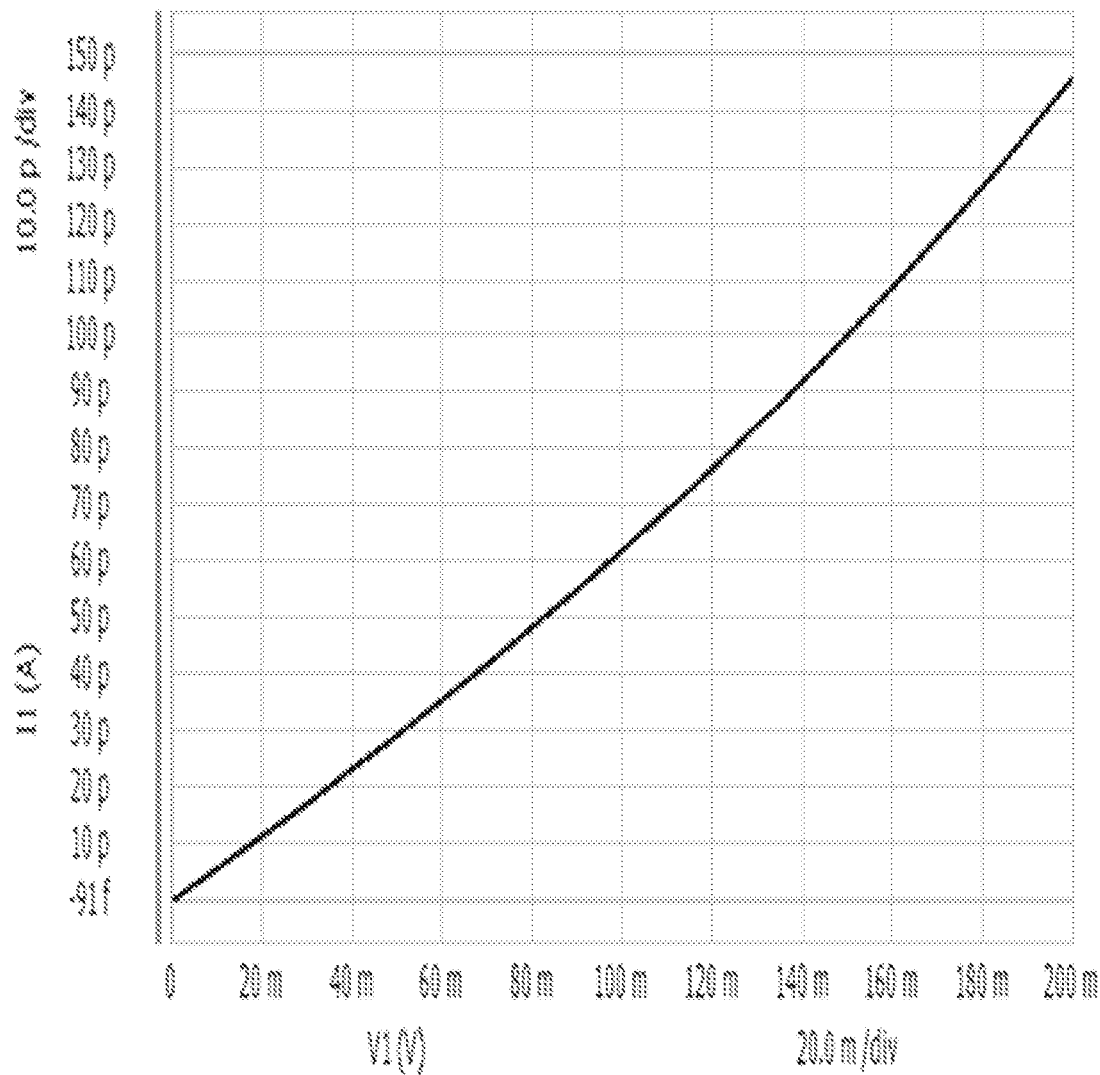
FIGS. 2D, 2E, and 2F illustrate current v. voltage (I-V) characteristics of the conventional RRAM device as described in connection with FIGS. 2A, 2B, and 2C.
Figure 2E:
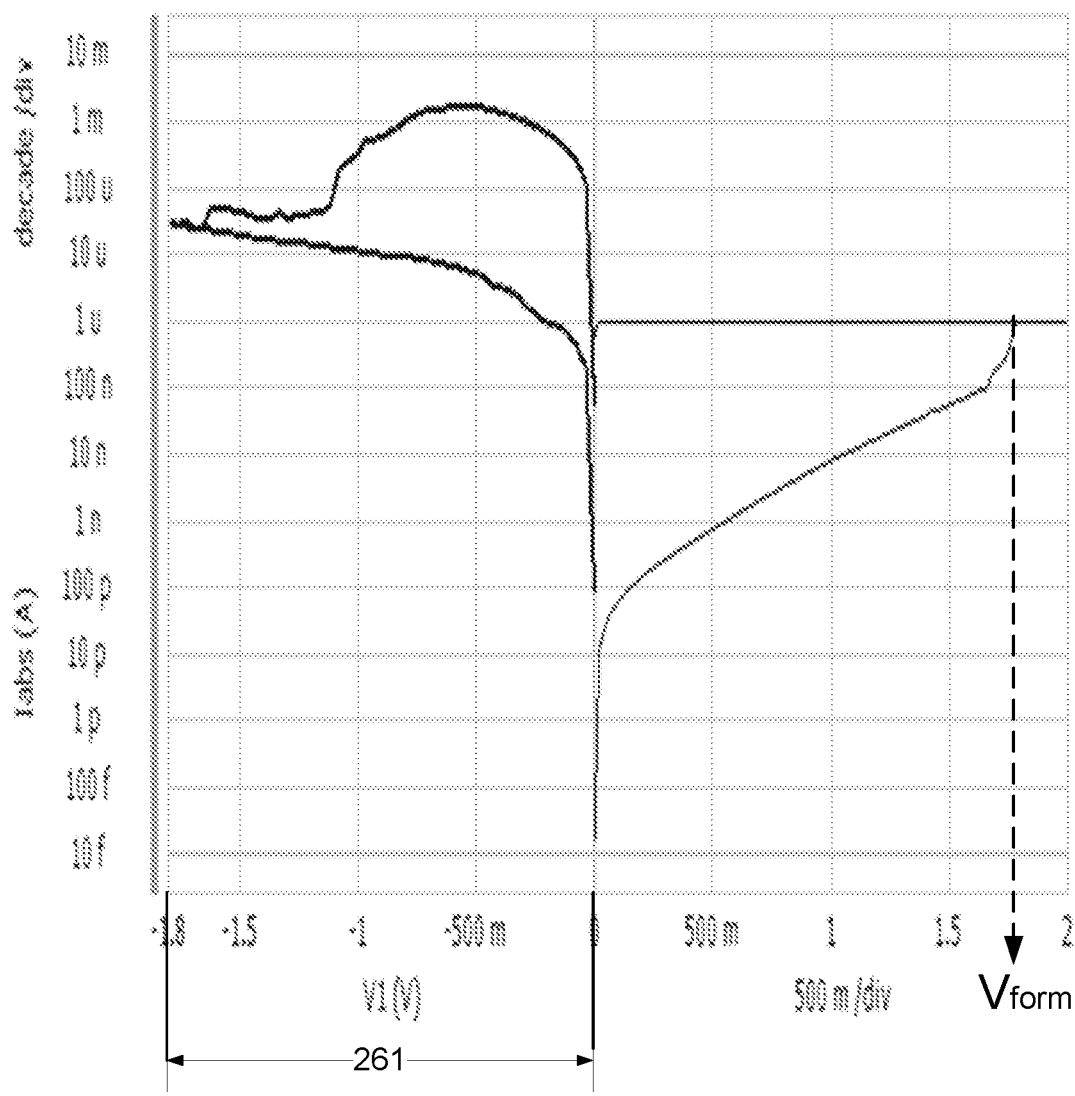
Figure 2F:
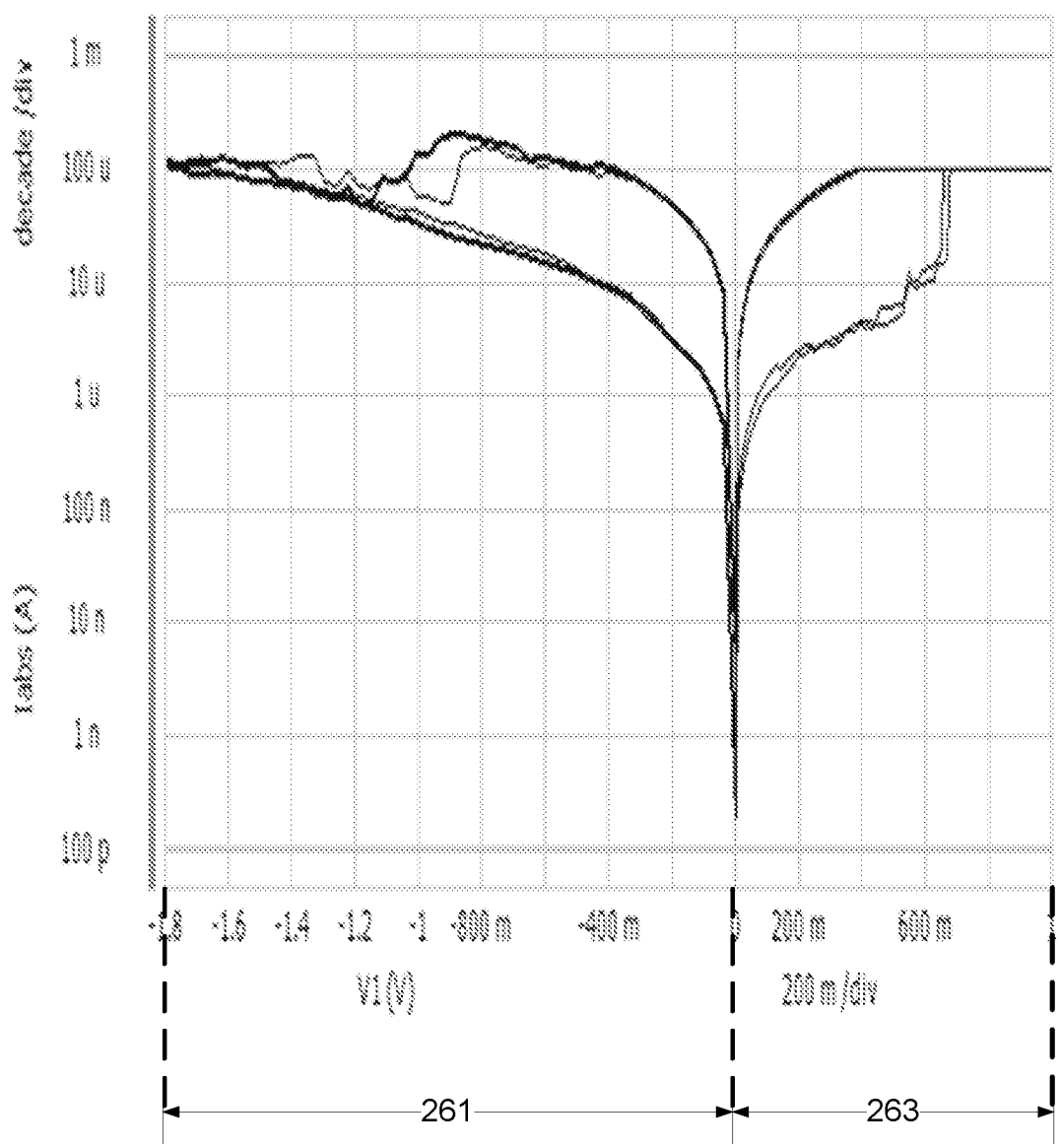

FIGS. 2D, 2E, and 2F are diagrams 200d, 200e, and 200f illustrating current v. voltage (I-V) characteristics of the conventional RRAM devices as described in connection with FIGS. 2A-2C. FIG. 2D is an I-V curve 200d of the conventional RRAM device in its virgin state. As shown, the virgin resistance of the conventional device is about 1.3 GΩ at 0.2 V. As such, the conventional RRAM device may be regarded as an insulator in its virgin state. As shown in FIG. 2E, a forming process may be performed by applying a forming voltage $V_{form}$ to the RRAM device. The forming voltage may be about 1.7 V. After the forming process, the RRAM device may be reset to a high resistance state in a reset process (also referred to as the "initial reset process") by applying a reset voltage in the voltage range 261. The reset peak current through the RRAM device is about 1 mA in the initial reset process. As shown in FIG. 2F, the RRAM device may be switched between the high resistance state and the low resistance state by applying a suitable a set voltage within voltage range 263 and a reset voltage within voltage range 261, respectively. The set voltage may be about 0.7 V. The reset peak current may be about 100 μA. Accordingly, forming the conventional RRAM device requires the application of a high forming voltage. The reset peak current in the initial reset process is high. The conventional RRAM device operates at high operation currents. The resistance of the conventional RRAM device cannot be switched without a forming process.

Figure 3:
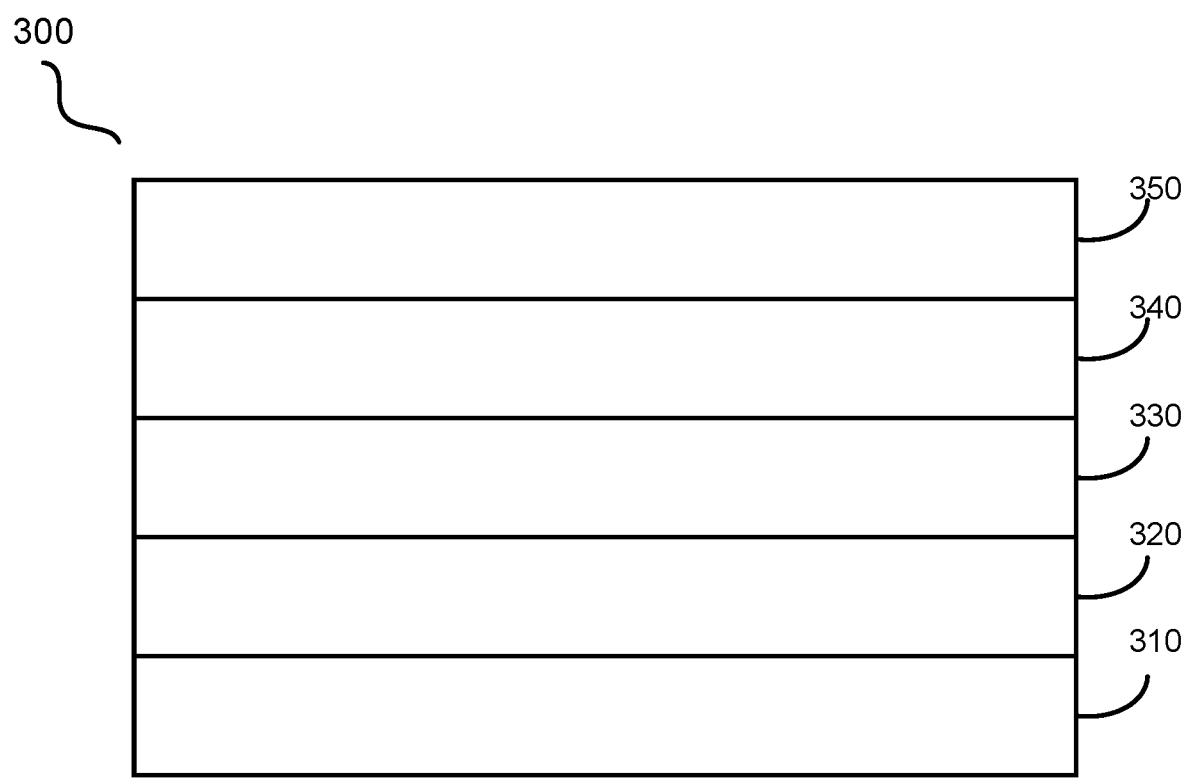
FIG. 3 is a schematic diagram illustrating cross-sectional views of an example forming-free RRAM device in accordance with some embodiments of the present disclosure.

FIG. 3 is a schematic diagram illustrating cross-sectional views of an example forming-free RRAM cell 300 in accordance with some embodiments of the present disclosure. RRAM cell 300 is also referred to as an RRAM device herein.

As shown, RRAM cell 300 may include a substrate 310, a bottom electrode 320, a switching oxide layer 330, an interface layer 340, and a top electrode 350. The interface layer 340 is fabricated between top electrode 350 and switching oxide layer 330.

Substrate 310 may include one or more layers of any suitable material that may serve as a substrate for an RRAM device, such as silicon (Si), silicon dioxide ($SiO_2$), silicon nitride ($Si_3N_4$), aluminum oxide ($Al_2O_3$), aluminum nitride (AlN), etc. In some embodiments, substrate 310 may include diodes, transistors, interconnects, integrated circuits, etc. In some embodiments, the substrate may include a driving circuit including one or more electrical circuits (e.g., an array of electrical circuits) that may be individually controllable. In some embodiments, the driving circuit may include one or more complementary metal-oxide-semiconductor (CMOS) drivers.

Bottom electrode 320 may be and/or include any suitable material that is electronically conductive and non-reactive to the switching oxide, such as platinum (Pt), palladium (Pd), iridium (Ir), titanium nitride (TiN), tantalum nitride (TaN), etc.

Switching oxide layer 330 may include one or more transition metal oxides, such as $TaO_x$, $HfO_x$, $TiO_x$, $NbO_x$, $ZrO_x$, etc., in binary oxides, ternary oxides, and high order oxides, wherein x may be used to indicate the oxide being oxygen deficient compared to its full (or terminal) oxide and the value of x may be varied from the oxygen to metal atomic ratio in the stoichiometry of its full oxide, such as $x \leq 2.0$ for $HfO_x$ (where $HfO_2$ being the full oxide), and $x \leq 2.5$ for $TaO_x$ (where $Ta_2O_5$ being the full oxide). As an example, switching oxide layer 330 may include $Ta_2O_5$ and/or $HfO_2$.

Top electrode 350 may include any suitable metallic material that is electronically conductive and reactive to the switching oxide. For example, the metallic material in top electrode 350 may include Ta, Hf, Ti, TiN, TaN, etc. Top electrode 350 may be reactive to the switching oxide and may have suitable oxygen solubility to adsorb some oxygen from switching oxide layer 330 and create oxygen vacancies in switching oxide layer 330. That is, the reactive metallic material(s) in top electrode 350 may have suitable oxygen solubility and/or oxygen mobility. In some embodiments, top electrode 350 not only may be able to create oxygen vacancies in switching oxide layer 330 (e.g., by scavenging oxygen) but also may function as an oxygen reservoir or source to switching oxide layer 330 during cell programming.

In one implementation, top electrode 350 may include one or more alloys. Each of the alloys may contain two or more metallic elements. Each of the alloys may include a binary alloy (e.g., an alloy containing two metallic elements), a ternary alloy (e.g., an alloy containing three metallic elements), a quaternary alloy (e.g., an alloy containing four metallic elements), a quinary alloy (e.g., an alloy containing five metallic elements), a senary alloy (e.g., an alloy containing six metallic elements), and/or a high order alloy (e.g., an alloy containing more than six metallic elements). In some embodiments, top electrode 350 may include one or more alloys containing a first metallic element and one or more second metallic elements. Each of the second metallic elements may be less or more reactive to the transition metal oxide in the switching oxide layer than the first metallic element. In some embodiments, the first metallic element may be Ta. The second metallic elements may include one or more of W, Hf, Mo, Nb, Zr, etc.

Interface layer 340 is in thermal chemical equilibrium with the top electrode 350 and switching oxide layer 330 and does not react with either top electrode 350 or switching oxide layer 330. Interface layer 340 may thus reduce the diffusion and reaction between the top electrode 350 and the switching oxide layer 330. Interface layer 340 may be and/or include a film of a material that is more chemically stable than the transition metal oxide(s) in the switching oxide layer 330. As a result, the material may not react with the transition metal oxide(s) of the switching oxide layer 330. As an example, the transition metal oxide(s) of the switching oxide layer may be and/or include $HfO_x$ and/or $TaO_y$, wherein $x \leq 2.0$ and $y \leq 2.5$, and interface layer 340 may include one or more layers of $Al_2O_3$, MgO, $Y_2O_3$, $La_2O_3$, etc. In one some embodiments, interface layer 340 may include a continuous film of the material more chemically stable than the transition metal oxide (e.g., a film with a thickness greater than or equal to 1 nm). In some embodiments, interface layer 340 may be non-continuous (e.g., a film with a thickness of 0.2 nm-0.6 nm).

RRAM cell 300 may be annealed in one or more annealing processes to achieve desirable forming-free behavior. Each of the annealing processes may involve annealing the RRAM device in forming gas ambient at suitable temperatures (e.g., 350-450° C.) for a suitable period of time (e.g., 15-30 minutes). The forming gas may include a mixture of nitrogen ($N_2$) and hydrogen ($H_2$) in a suitable ratio (e.g., 95:5, 90:10, etc.). The thickness of interface layer 340 may be determined based on the device size of the RRAM cell 300 (the critical size, a device area, etc.) and the annealing conditions. A smaller device size may require a longer annealing time and/or a thinner interface layer 340 to reduce the virgin resistance of the forming-free RRAM.

The annealing may enhance the diffusion and reaction between top electrode 350 and switching oxide layer 330 while interface layer 340 may reduce the diffusion and reaction between top electrode 350 and switching oxide layer 330. Balancing and/or optimizing interface layer 340 and thermal budgets related to the annealing (e.g., annealing temperatures, annealing times, etc.) in view of the device size of RRAM cell 300 may control the virgin resistance of RRAM cell 300 in a desirable target range and may achieve desirable device behavior, such as forming free, low energy switching, low device-to-device performance variations, etc. As will be described in greater details in connection with FIGS. 9A-9J, the thickness of interface layer 340 may be determined based on the device size of the RRAM cell 300 and the thermal budgets. In some embodiments, the virgin resistance of a forming-free RRAM cell 300 may be between about 1 kΩ and about 1 MΩ. In some embodiments, the virgin resistance of RRAM cell 300 may be hundreds of ohms to a few kilo-ohms (e.g., 500 Ω-5 kΩ).

Figure 4:
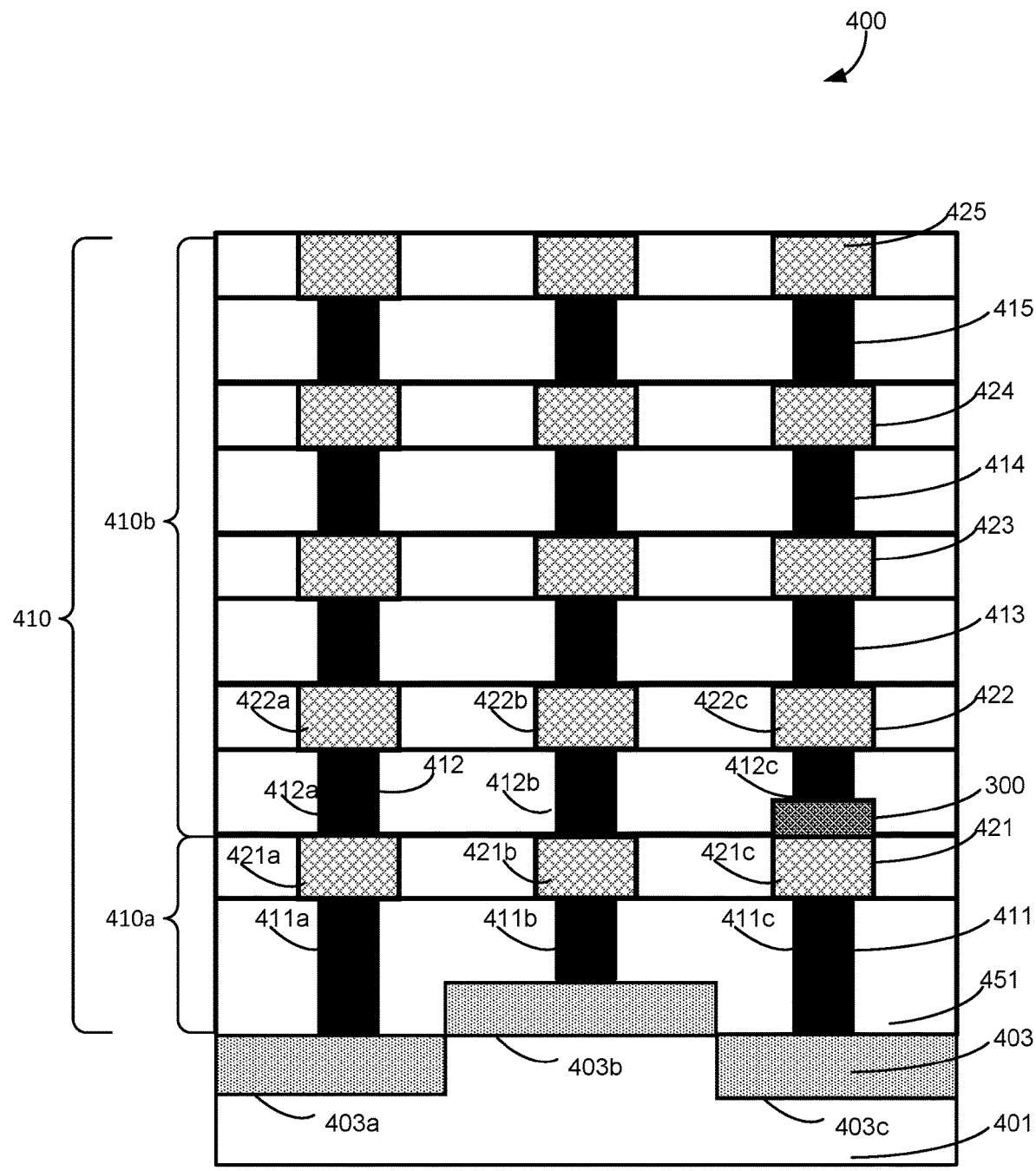
FIG. 4 is a schematic diagram illustrating cross-sectional views of a semiconductor device including an example forming-free RRAM device in accordance with some embodiments of the present disclosure.

In some embodiments, the RRAM cell 300 may be fabricated during a CMOS process. The thermal budgets for annealing the RRAM cell 300 may be determined based on the annealing conditions related to the CMOS process. For example, as shown in FIG. 4, a semiconductor device 400 may include a transistor 403 that is fabricated on a substrate 401. The transistor 403 may include a source region 403a, a gate 403b, and a drain region 403c. Interconnect layers 410 may be fabricated on the transistor 403 and the substrate 401.

Each of interconnect layers 410 may provide electrical connectivity between the transistor 403 and/or one or more other devices (e.g., one or more other transistors, the RRAM cell 300, one or more other RRAM devices, etc.). Interconnect layers 410 may include, for example, via layers (or via layers) 411, 412, 413, 414, and 415 and metal layers (or pad layers) 421, 423, 424, and 425. Each of the via layers may include one or more metal vias. Each of the metal vias may include a suitable metallic material, such as Al, Cu, W, etc. Each of the metal layers may include one or more metal pads, and/or one or more metal wires. Each of the metal pads may include a suitable metallic material, such as Al, Cu, W, etc. For example, the via layer 411 may include metal vias 411a, 411b, and 411c that may be connected to the source region 403a, the gate 403b, and the drain region 403c of the transistor 403, respectively. In some embodiments, the via layer 411 may include tungsten (W) vias and doped polycrystalline Si (poly-Si) terminals where poly-Si terminals may be in direct contact with the gate 403b, the source region 403a, and the drain region 403c of the transistor 403. The tungsten vias may be in direct contact with the poli-Si terminals. The other via layers and metals layers above the via layer 411 may be fabricated with Cu, W, Al, etc. The metal layer 421 may include metal pads 421a, 421b, and 421c. The metal pads 421a, 421b, and 421c may be connected to the metal vias 411a, 411b, and 411c, respectively. As shown, a pair of neighboring metal layers may be connected via a via layer fabricated between the neighboring metal layers.

Fabricating an interconnect layer 410 may involve fabricating a layer of a dielectric material using suitable deposition techniques, such as chemical vapor deposition (CVD), physical vapor deposition (PVD), atomic layer deposition (ALD), plasma-enhanced chemical vapor deposition (PECVD), sputtering, etc. The dielectric layer may be patterned to create one or more vias. One or more suitable metallic materials may be deposited in the vias and patterned to fabricated one or more metal vias and/or metal pads. The metal vias and/or the metal pads may then be annealed in a forming gas environment. In some embodiments, a via layer and a metal layer may be fabricated in a dual-damascene fabrication process in which metal vias and metal pads are fabricated during the same metal deposition and patterning process and annealed together.

As an example, to fabricate the first via layer 411, a dielectric layer 451 may be fabricated on the substrate 401 and the transistor 403. The dielectric layer 451 may include any suitable dielectric material, such as silicon nitride ($Si_3N_4$), silicon dioxide ($SiO_2$), etc. The dielectric layer 451 may be processed utilizing any suitable deposition techniques. For example, the dielectric layer 451 may be patterned and filled by metal deposition to fabricate the metal vias 411a, 411b, and 411c in the dielectric layer 451.

The RRAM cell 300 may be fabricated during the fabrication of interconnect layers 410 and may thus be referred to as a CMOS-compatible RRAM device. For example, the RRAM cell 300 may be fabricated on a metal pad or a metal via of the top interconnect layer of first interconnect layers 410a. One or more second interconnect layers 410b may then be fabricated on the RRAM cell 300 and the first interconnect layers 410a. More particularly, for example, a metal pad or metal via of the bottom interconnect layer of the second interconnect layers 410b may be fabricated on the RRAM cell 300 and may directly contact the RRAM cell 300.

Fabricating each second interconnect layer 410b may involve annealing the second interconnect layer in association with the RRAM cell 300. In some embodiments, a via layer and a metal layer may be fabricated in a dual-damascene fabrication process in which metal vias and metal pads are fabricated during the same metal deposition and patterning process and annealed together. Interface layer 340 may have a suitable thickness to achieve desirable forming gas anneal (FGA) resistance. For example, a relatively thicker interface layer may be more FGA resistant than a relatively thinner interface layer. As such, the thermal budgets for annealing the RRAM cell 300 may be determined based on the location of the RRAM cell 300, the number of second interconnect layers to be fabricated on the RRAM cell 300, and/or the annealing conditions that are utilized to anneal the second interconnect layers. The thickness of interface layer 340 may then be optimized based on the annealing conditions and the device size of the RRAM cell 300.

While certain interconnect layers (e.g., metal layers and via layers) are shown in FIG. 4, this is merely illustrative. The first interconnect layers 410a and the second interconnect layers 410b may include any suitable number of interconnect layers. For example, the RRAM cell 300 may be fabricated on the metal layer 413 in some embodiments. In some embodiments, the semiconductor device 400 and/or interconnect layers 410 may be fabricated utilizing the techniques described in U.S. patent application Ser. No. 17/848,238, filed Jun. 23, 2022, which is incorporated herein by reference.

FIGS. 5A-5D are diagrams illustrating I-V curves 500A, 500B, 500C, and 500D of a first example forming-free RRAM according to some embodiments of the present disclosure.

Figure 5A:
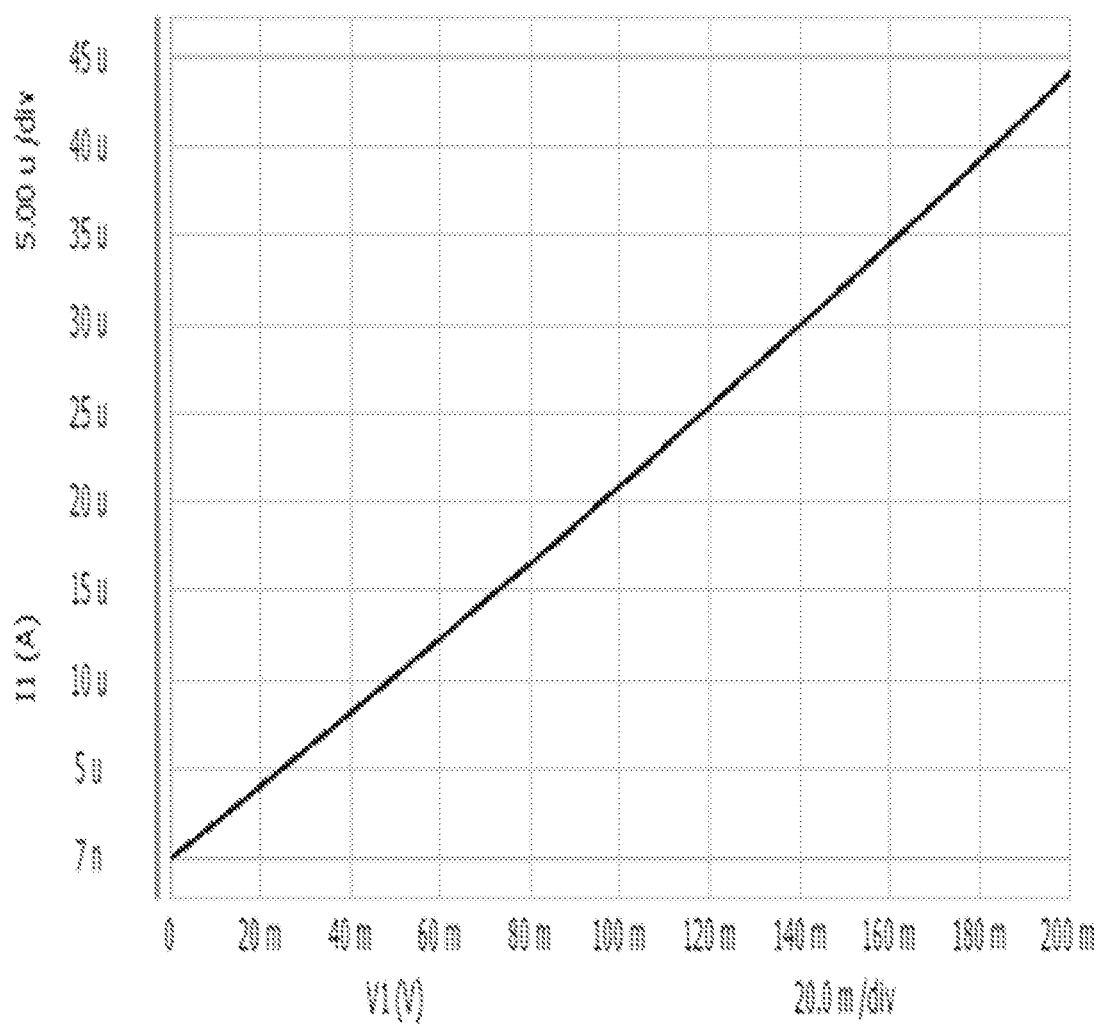
FIGS. 5A-5D are diagrams illustrating I-V characteristics of a first example forming-free RRAM device in accordance with some embodiments of the present disclosure.

FIG. 5A illustrates an I-V curve 500A of the RRAM in a virgin state. The horizontal axis of I-V curve 500A represents read voltages applied to the RRAM device in the virgin state. The vertical axis of I-V curve 500A represents the current through the RRAM device during the application of the read voltages. As shown, the virgin resistance of the RRAM device is about 4.5 k$\Omega$ at 0.2 V.

Figure 5B:
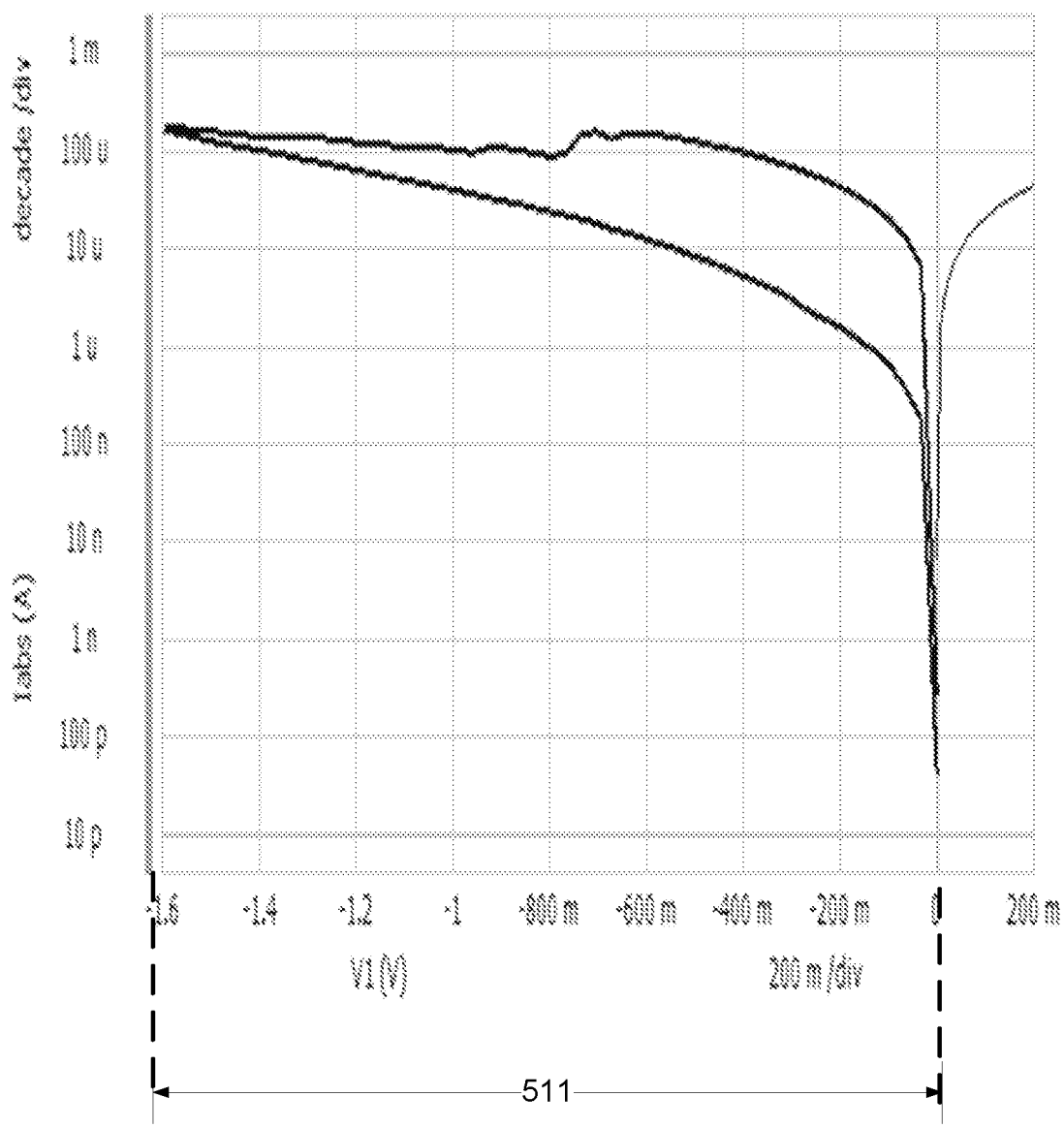

As shown in FIG. 5B, a reset voltage in voltage range 511 may be applied to the RRAM device to switch the RRAM device from the virgin resistance to a target resistance greater than the virgin resistance (also referred to as the "first target resistance"). The virgin resistance of the RRAM device is reset without previously performing a forming process or an initial set process on the RRAM device. As an example, the resistance of the RRAM device may be reset to about 127 k$\Omega$. As illustrated in FIG. 5B, the reset peak current through the RRAM device is lower than 200 μA and is significantly lower than a reset current required to reset a conventional RRAM device after forming.

Figure 5C:
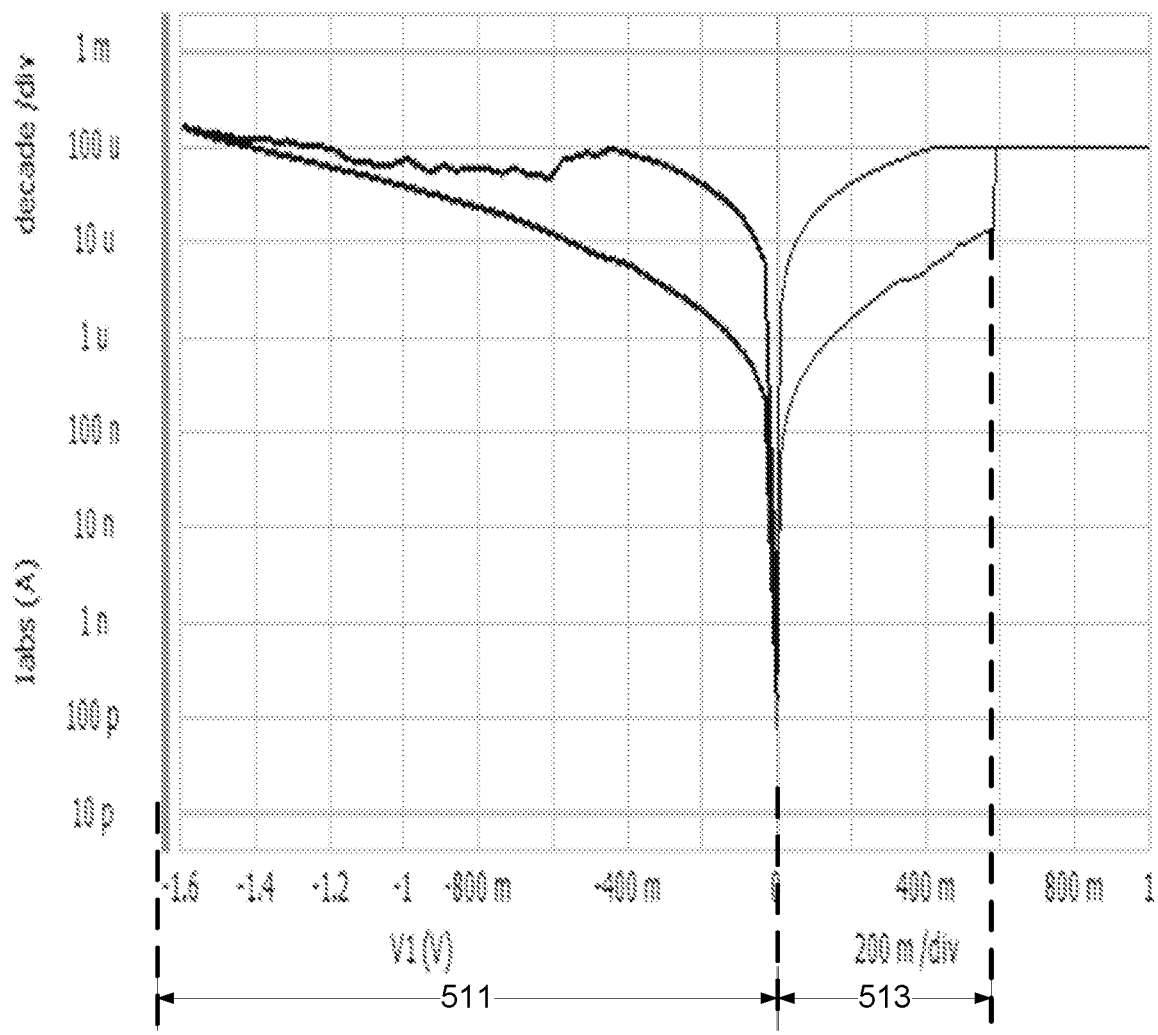

After the reset process, the resistance of the RRAM device may be set to a second target resistance that is greater than the first target resistance. For example, as shown in FIG. 5C, a set voltage in the voltage range 513 may be applied to the RRAM device in the set process. In some embodiments, the set voltage is about 0.6 V. The set voltage and the reset voltage are of opposite polarity. In some embodiments, the resistance of the RRAM device is about 5.2 k$\Omega$ at 0.2 V after the set process.

Figure 5D:
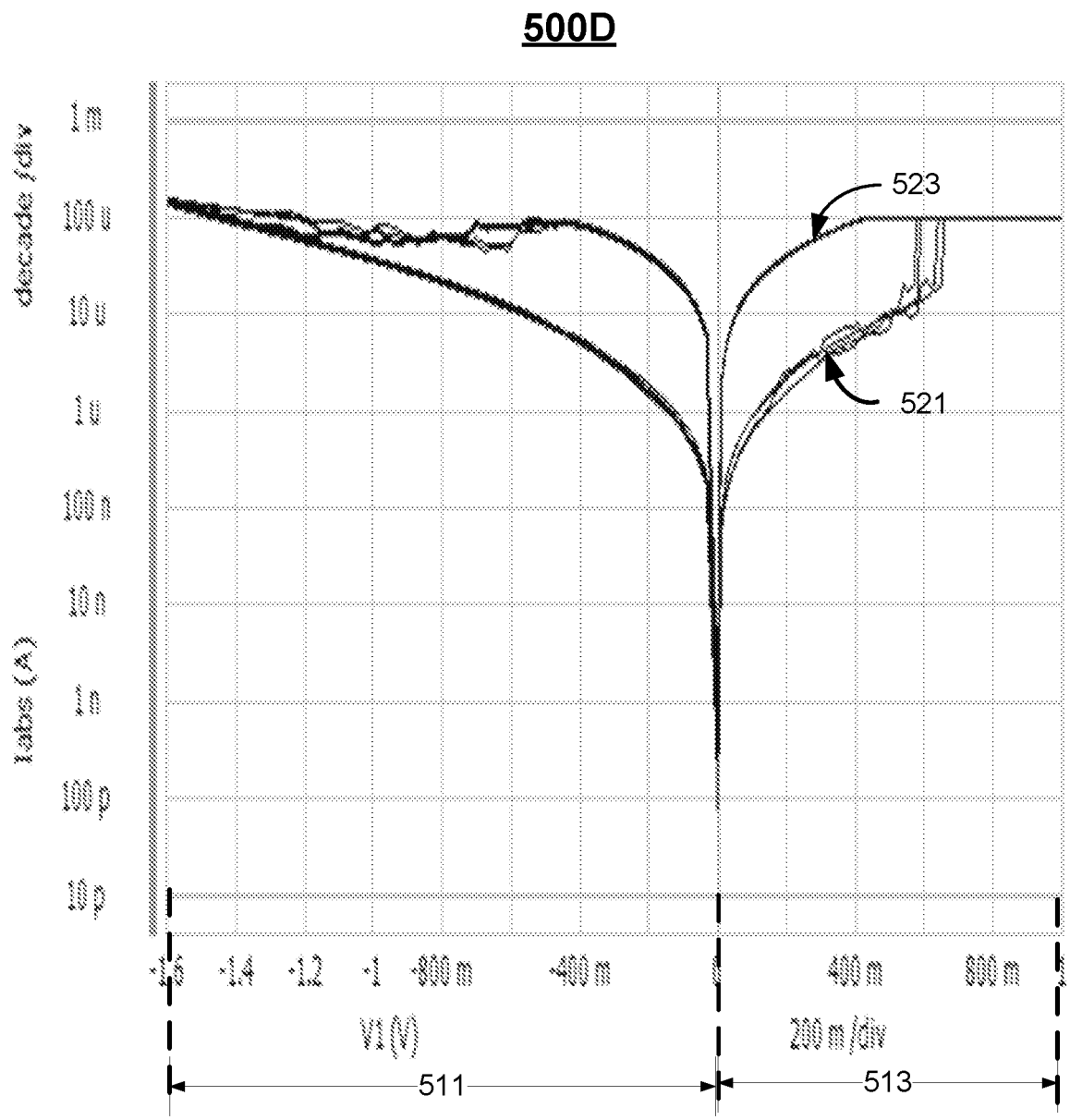

As shown in FIG. 5D, the resistance of the RRAM device may be switched between a high resistance state 521 and a low resistance state 523 under set voltages in the voltage range 513 or the reset voltages in the voltage range 511. A set voltage may be about 0.6 V. The reset peak current is about or not greater than 200 μA. In some embodiments, the reset peak current is about or not greater than 500 μA. As shown in FIGS. 5A-5D, the RRAM device may be reset to a desirable target resistance at a low initial reset peak current without a previous forming process and an initial reset process. The RRAM device switches at low voltages and with large Ion/Ioff ratio and operates at ultra-low current.

FIGS. 6A-6D are diagrams illustrating current v. voltage curves (I-V curves) 600A, 600B, 600C, and 600D of a second example forming-free RRAM device according to some embodiments of the present disclosure.

Figure 6A:
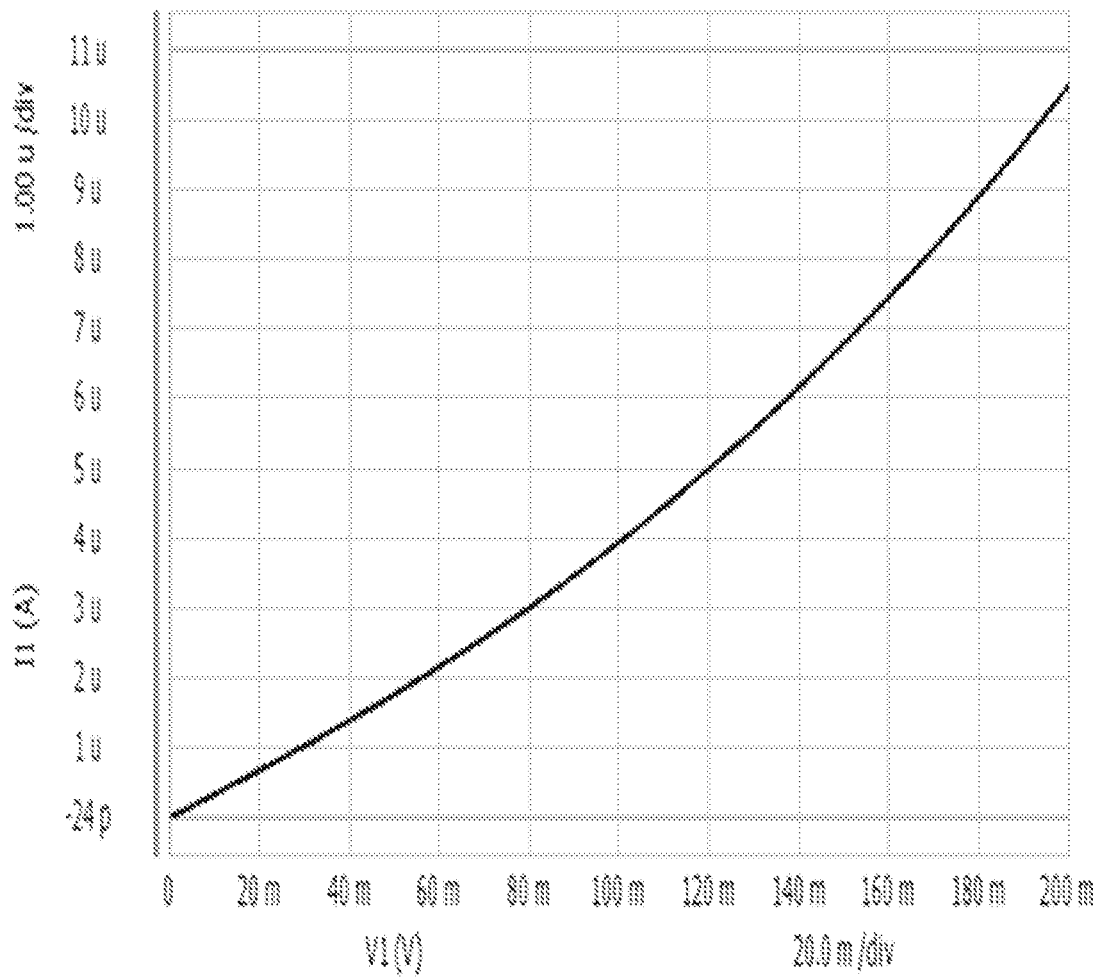
FIGS. 6A-6D are diagrams illustrating I-V characteristics of a second example forming-free RRAM device in accordance with some embodiments of the present disclosure.

FIG. 6A illustrates an I-V curve 600A of the RRAM in a virgin state. The horizontal axis of I-V curve 500A represents read voltages applied to the RRAM device in the virgin state. The vertical axis of I-V curve 600A represents the current through the RRAM device during the application of the read voltages. The virgin resistance of the RRAM device is about 19 kΩ at 0.2 V.

Figure 6B:
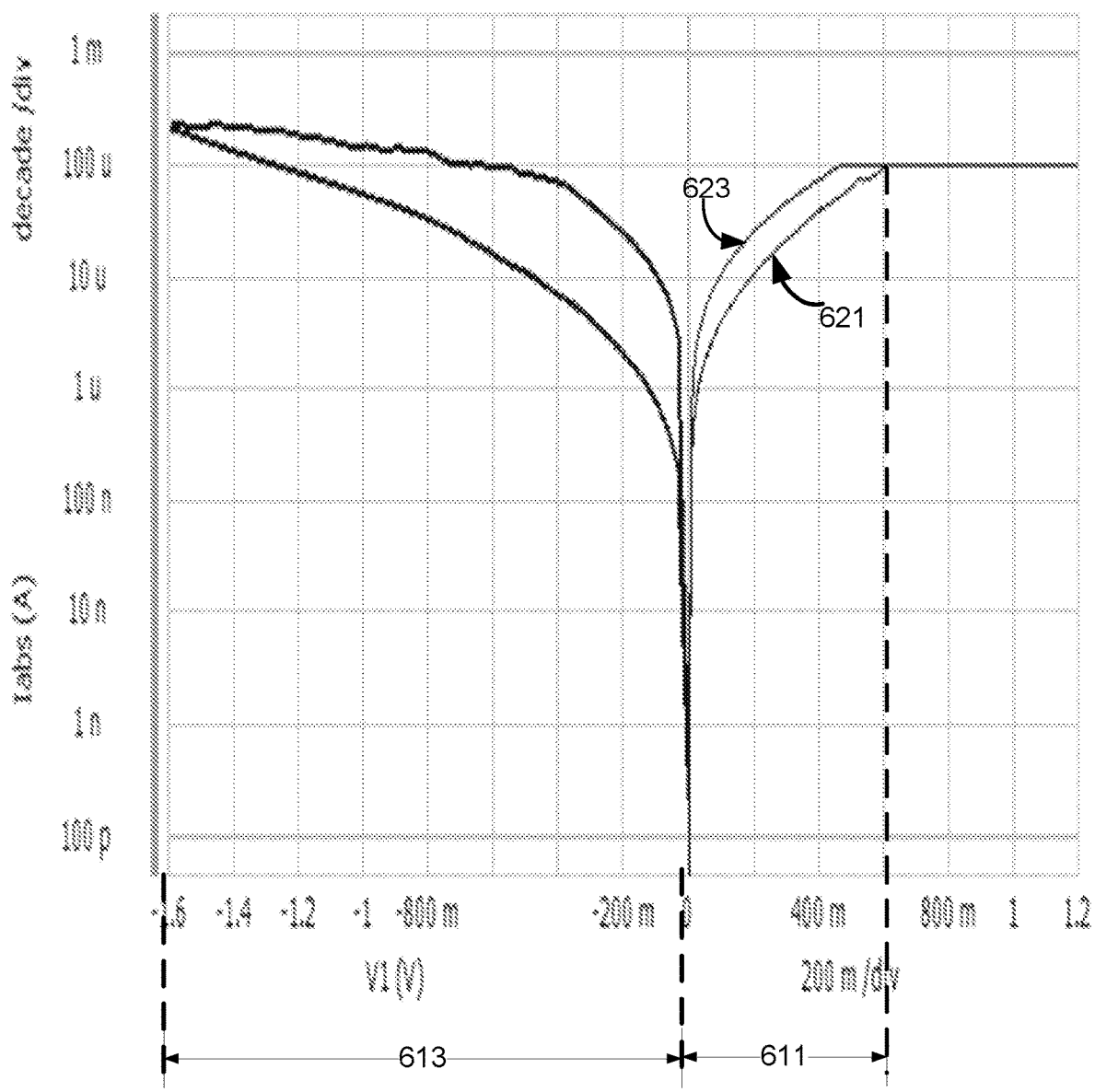

As shown in FIG. 6B, the RRAM device may be switched from the virgin state 621 to a lower resistance state 623 by applying a set voltage in voltage range 611. As an example, the set voltage may be about 0.6 V, which is much lower than a forming voltage required for electrically forming a conventional RRAM device. After the setting process, the resistance of the RRAM device is about 8 kΩ at 0.2 V.

After the setting process, the RRAM device may be reset to a higher resistance by applying a reset voltage in voltage range 613 to the RRAM device. The reset peak current may be lower than 200 μA, which is significantly lower than a reset peak current required to reset a conventional device after forming. The resistance of the RRAM device may be about 100 kΩ after the resetting.

Figure 6C:
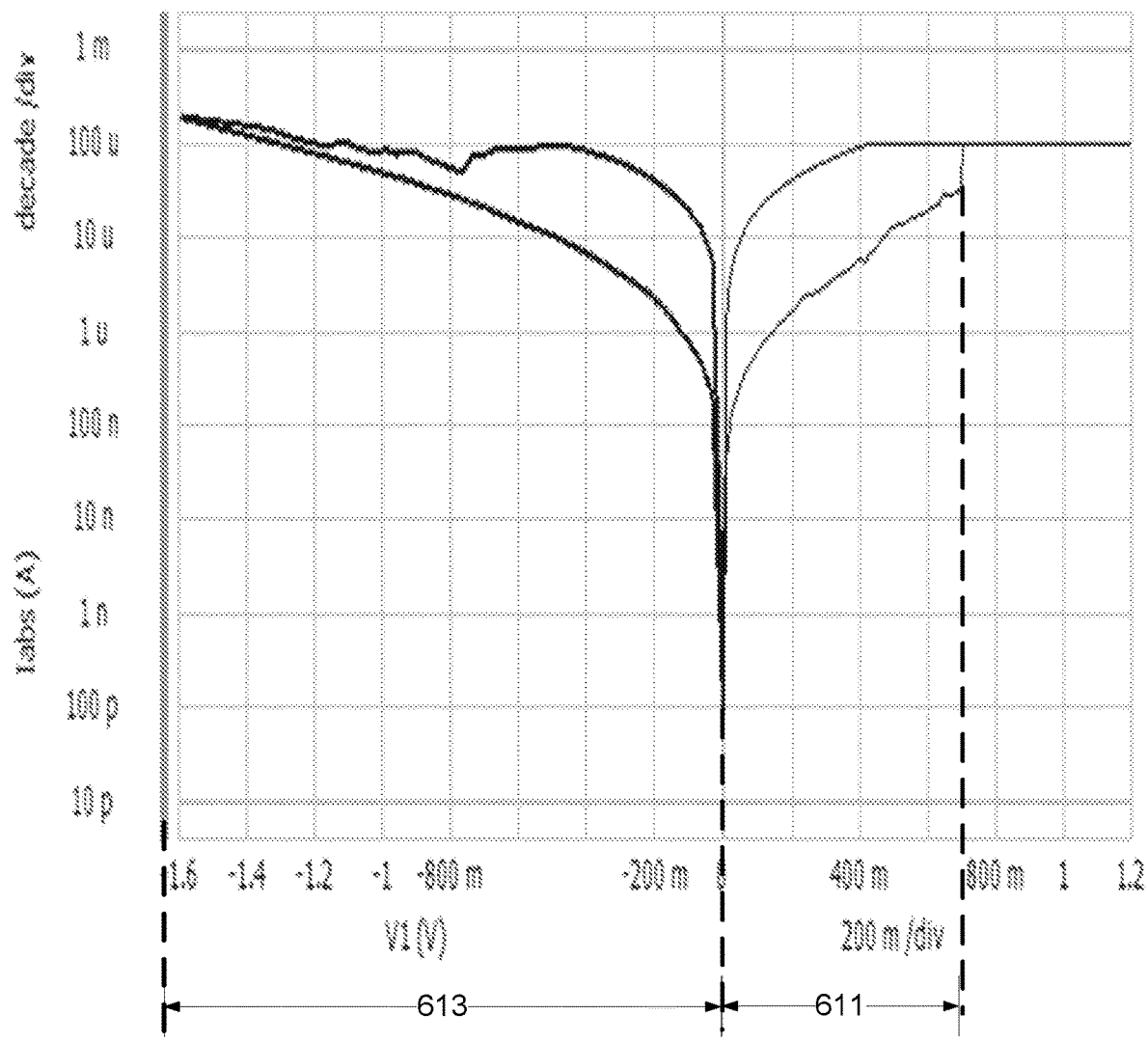
Figure 6D:
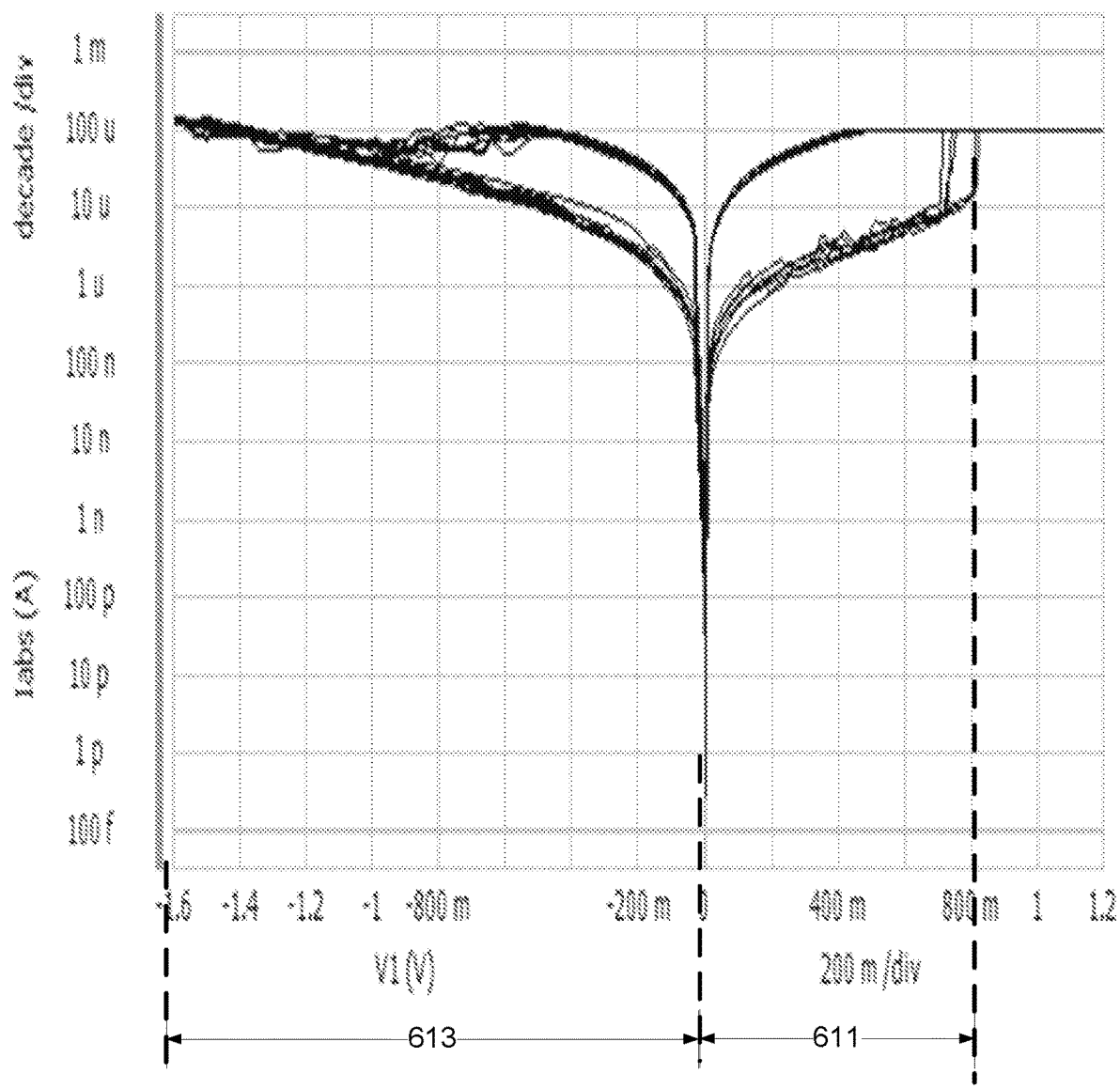

As shown in FIGS. 6C and 6D, the RRAM device may be switched on and off repeatedly under set voltages in the voltage range 611 or the reset voltages in the voltage range 613. As an example, the resistance of the RRAM device may be set to about 5 kΩ by applying a set voltage of 0.7 V to the RRAM device. In some embodiments, the set voltage may be about or lower than 1 V. As another example, the resistance of the RRAM device may be reset to about 100 kΩ under reset peak current about or lower than 200 μA. As shown in FIGS. 6A-6D, the RRAM device may be reset to a desirable target resistance at a set voltage that is significantly lower than a forming voltage required in a forming process and operates at low voltages and current in subsequent switching events.

Figure 7A:
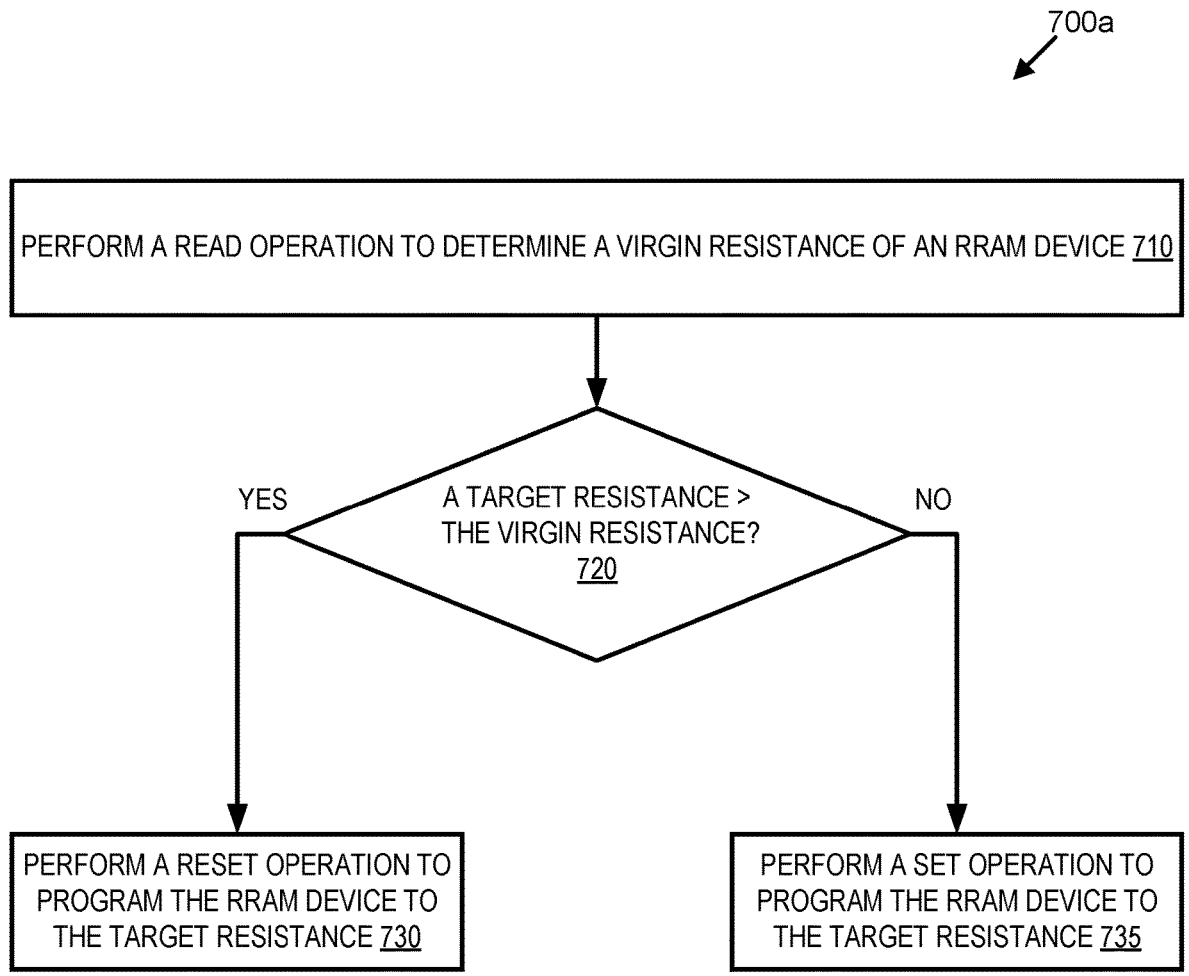
FIGS. 7A, 7B, and 7C are flowcharts illustrating example processes for operating a forming-free RRAM device in accordance with some embodiments of the present disclosure.

FIG. 7A is a flowchart illustrating an example process 700a for operating a forming-free RRAM device in accordance with some embodiments of the present disclosure. The resistance of the forming-free RRAM device may be switched to one of multiple resistance levels without a forming process.

At 710, a read operation may be performed to determine a virgin resistance of the RRAM device. For example, one or more read voltages may be applied to the RRAM device in its virgin state to determine the virgin resistance of the RRAM device. The read voltages may be, for example, a voltage between 0.05-0.5 V. It is to be noted that a read operation may not be performed on a conventional RRAM without previously performing a forming process as the conventional RRAM is not conductive in its virgin state.

At 720, the virgin resistance may be compared to a target resistance to determine whether the virgin resistance is greater than the target resistance. The target resistance may be a desirable resistance or a weight to which the RRAM device is programmed.

In some embodiments, the target resistance may be greater than the virgin resistance of the RRAM device. In such embodiments, process 700 may proceed to 730 and may perform a reset operation to program the RRAM device to the target resistance. For example, a reset voltage may be applied to the RRAM device. The reset current may be hundreds of micro ampere (μA). Unlike the conventional RRAM device as described in connection with FIGS. 2A-2F, the forming-free RRAM device can be programmed to the target resistance without a forming process and an initial reset process following the forming process.

In some embodiments, the virgin resistance of the RRAM device may be greater than the target resistance. In such embodiments, process 700 may proceed to 735 and may perform a set operation on the RRAM device to program the RRAM device to the target resistance. For example, a set voltage may be applied to the RRAM device. The set voltage may be about 0.3-0.7 V in some embodiments. In some embodiments, the set voltage may be about 0.5-1 V. As such, the forming-free RRAM device may be set to the target resistance without a forming process that generates a conductive filament in the RRAM device.

Figure 7B:
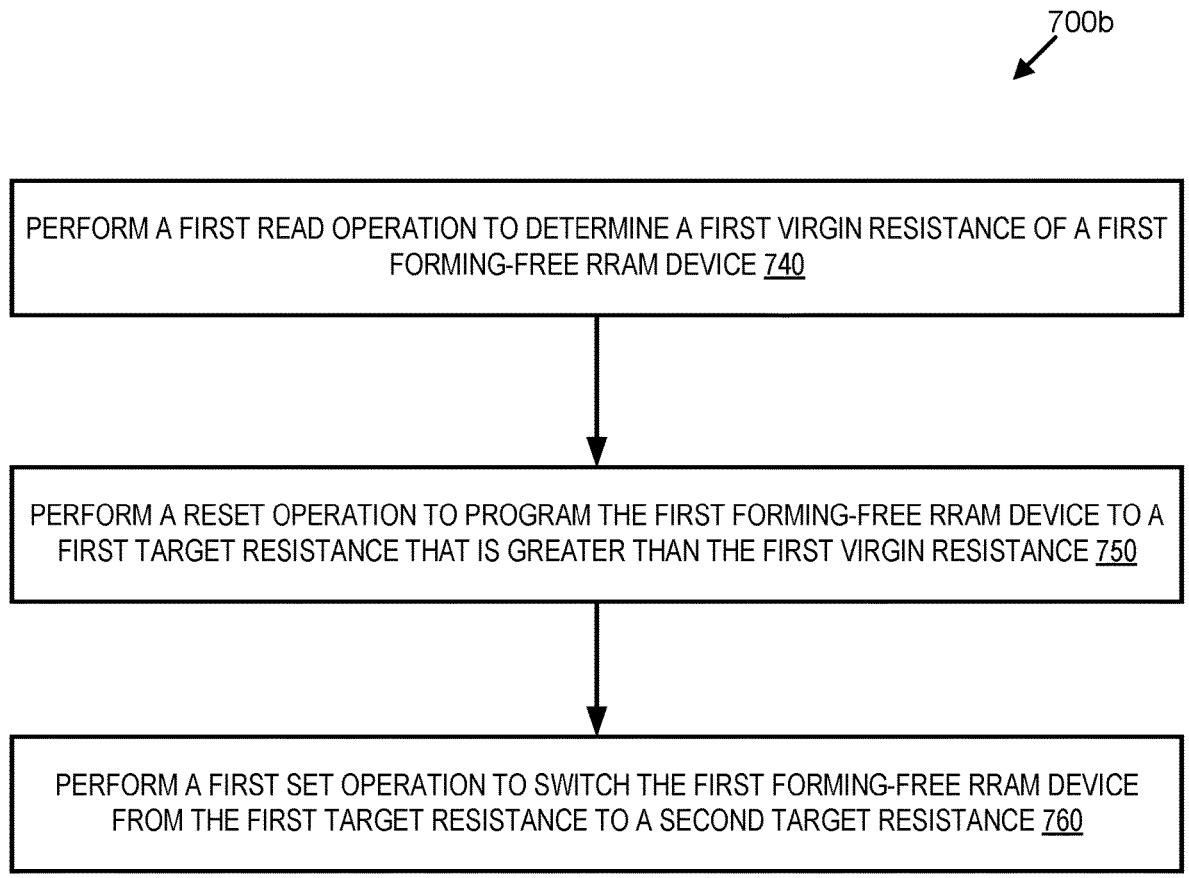

FIG. 7B is a flowchart illustrating an example process 700b for operating a forming-free RRAM device (also referred to as the "first forming-free RRAM device") in accordance with some embodiments of the present disclosure.

At 740, a first read operation may be performed on the first forming-free RRAM device in a virgin state to determine a first virgin resistance of the first forming-free RRAM device. The first virgin resistance represents a resistance of the first forming-free RRAM device in its virgin state without having undergone a forming process. Performing the first read operation on the first forming-free RRAM device in the virgin state involves applying one or more read voltages (e.g., a voltage of about 0.2 V) to the first forming-free RRAM device.

At 750, a first reset operation may be performed to program the first forming-free RRAM device to a first target resistance that is greater than the first virgin resistance. Performing the first reset operation may involve applying a reset signal (e.g., a voltage signal, a current signal, etc.) to the first forming-free RRAM device. The reset peak current through the first forming-free RRAM device during the first reset operation (also referred to as the "first reset current") may be about or less than 200 μA. In some embodiments, the first reset current may be about or less than 500 μA. The reset operation is performed without previously forming the first forming-free RRAM device in a forming process.

At 760, a first set operation may be performed on the first forming-free RRAM device to switch the first forming-free RRAM device from the first target resistance to a second target resistance. The first target resistance is greater than the second target resistance. Performing the first set operation may involve applying a first set voltage to the first forming-free RRAM device. In some embodiments, the first set voltage is not greater than 0.7 V. In some embodiments, the first set voltage is not greater than 1 V.

Figure 7C:
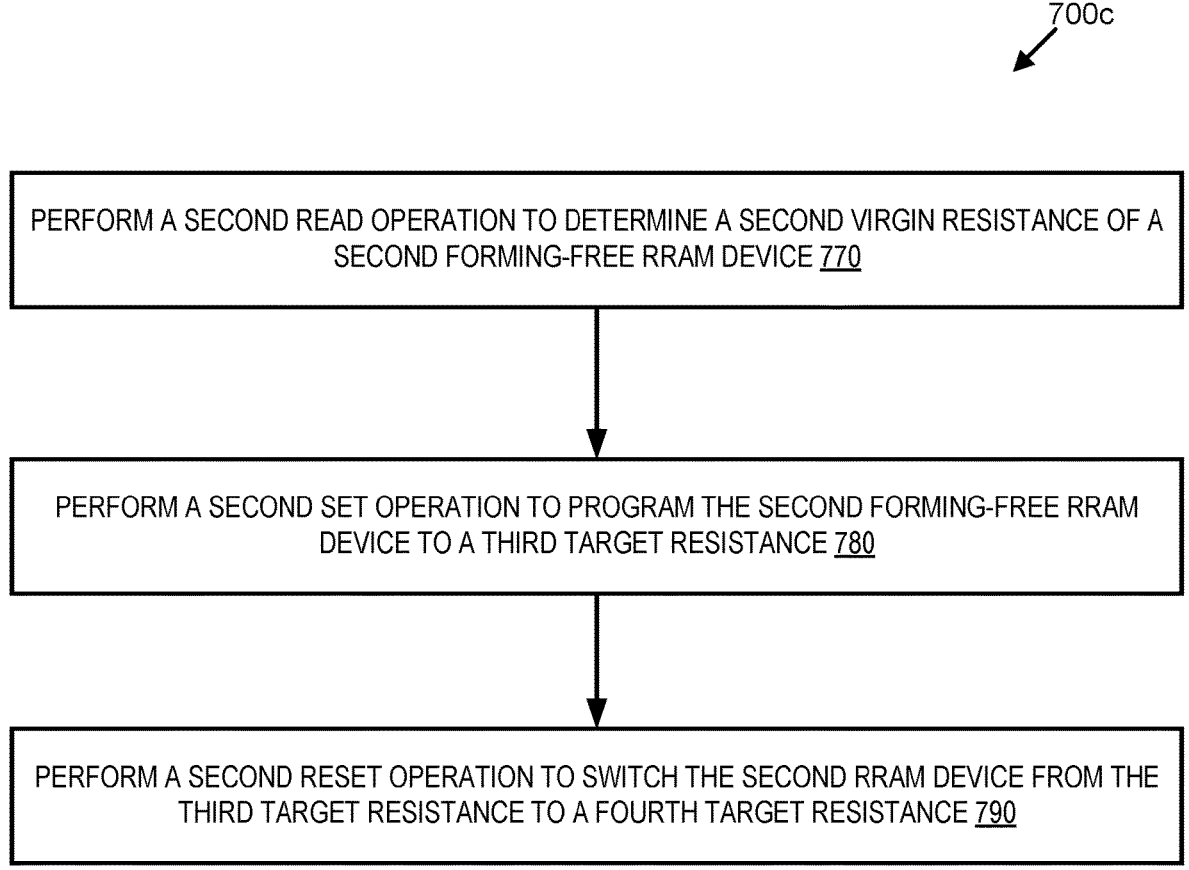

Referring to FIG. 7C, a flowchart showing an example process 700c for operating a forming-free RRAM device with a medium resistance (the "second forming-free RRAM device") in accordance with some embodiments of the present disclosure.

At 770, a second read operation may be performed on the second forming-free RRAM device in a virgin state to determine a virgin resistance of the second forming-free RRAM device (the "second virgin resistance"). The second virgin resistance represents a resistance of the second forming-free RRAM device in its virgin state without having undergone a forming process. Performing the second read operation on the second forming-free RRAM device involves applying one or more read voltages to the second forming-free RRAM device in the virgin state.

At 780, a second set operation may be performed to switch the second RRAM device from the second virgin resistance to a third resistance. The second virgin resistance is greater than the third target resistance. The second set operation is performed without previously performing a forming process on the second forming-free RRAM device. Performing the second set operation may involve applying a second set voltage to the second forming-free RRAM device. In some embodiments, the second set voltage is not greater than 0.7 V. In some embodiments, the second set voltage is not greater than 1 V.

At 790, a second reset operation may be performed to switch the second forming-free RRAM device from the third resistance to a fourth target resistance. The fourth target resistance may be smaller than the third target resistance. The reset operation is performed without previously performing a forming process on the second forming-free RRAM device.

Figure 8:
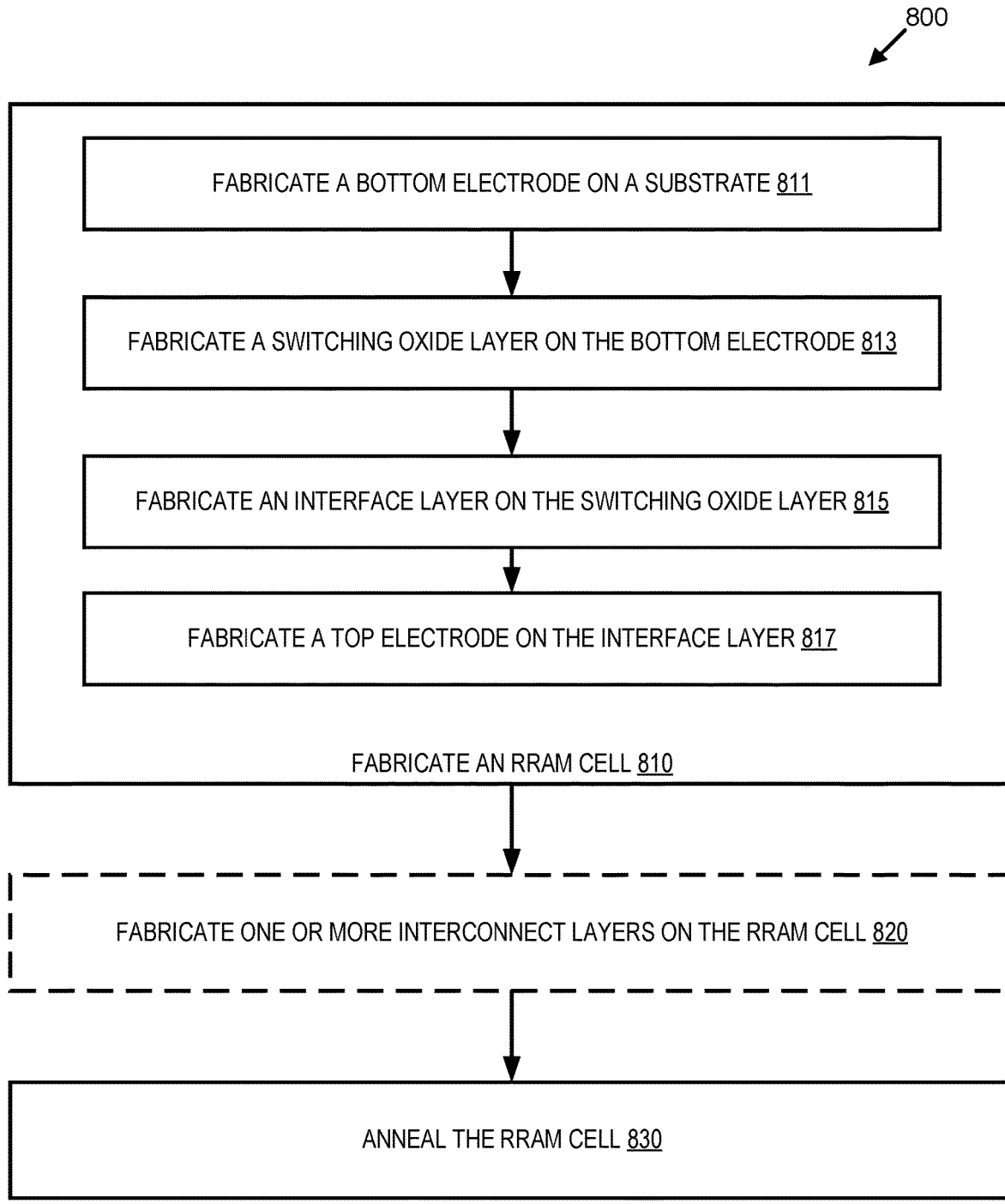
FIG. 8 is a flowchart illustrating an example process for fabricating a forming-free RRAM device in accordance with some embodiments of the present disclosure.

FIG. 8 is a flowchart illustrating an example process 800 for fabricating a forming-free RRAM device in accordance with some embodiments of the present disclosure.

At block 810, an RRAM cell may be fabricated. The RRAM cell may include a bottom electrode, a switching oxide layer, a top electrode, and an interface layer fabricated between the switching oxide layer and the top electrode. The RRAM cell may be the RRAM cell 300 of FIG. 3. In particular, a bottom electrode may be fabricated on a substrate at 811. Fabricating the first electrode may involve depositing one or more layers of one or more non-active metals, such as Pt, Pd, Ir, etc. utilizing a physical vapor deposition (PVD) technique, a chemical vapor deposition (CVD) technique, a sputtering deposition technique, an atomic layer deposition (ALD) technique, and/or any other suitable deposition technique. In some embodiments, fabricating the bottom electrode may involve depositing one or more layers of a metal nitride, such as TiN or TaN. The bottom electrode may be and/or include bottom electrode 320 as described in connection with FIG. 3 above.

At block 813, a switching oxide layer may be fabricated on the bottom electrode. The switching oxide layer may include one or more transition metal oxides. The transition metal oxides may include, for example, $TaO_x$, $HfO_x$, $TiO_x$, $NbO_x$, $ZrO_x$, etc. The switching oxide layer may be deposited utilizing PVD, CVD, ALD, and/or any other suitable deposition technique.

At block 815, an interface layer may be fabricated on the switching oxide layer. Fabricating the interface layer may involve depositing a material that is more chemically stable than the transition metal oxide(s) in the switching oxide layer, such as $Al_2O_3$, MgO, $Y_2O_3$, $La_2O_3$, etc. In one implementation, fabricating the interface layer may involve depositing a continuous layer of $Al_2O_3$, MgO, $Y_2O_3$, $La_2O_3$, etc. In another implementation, fabricating the interface layer may involve depositing a layer of the material having a suitable thickness (e.g., a thickness between about 0.2 nm and about 0.6 nm) to form a discontinuous film of $Al_2O_3$, MgO, $Y_2O_3$, $La_2O_3$, etc. The interface layer may be deposited utilizing PVD, CVD, ALD, and/or any other suitable deposition techniques.

At block 817, a top electrode may be fabricated on the interface layer. Fabricating the top electrode may involve depositing one or more suitable metallic materials that are electrically conductive and reactive to the switching oxide in the switching oxide layer, such as Ta, Hf, Ti, TiN, TaN, etc. The top electrode may include one or more alloys. The top electrode may be fabricated utilizing PVD, CVD, ALD, and/or any other suitable deposition technique.

At block 830, the RRAM cell may be annealed. For example, the RRAM cell may be annealed in one or more annealing processes, each of which may involve annealing the RRAM cell in a forming gas environment (e.g., a mixture of $N_2$ and $H_2$) at suitable annealing temperatures (e.g., 350-450° C.) for a suitable period of time (e.g., 15-30 minutes) for each anneal process.

In some embodiments, process 800 may further include block 820, where one or more interconnect layers are fabricated on the top electrode. In such embodiments, the RRAM cell may be annealed with the interconnect layers at block 830. Fabricating each of the interconnect layers may involve fabricating a layer of a dielectric material, such as $Si_3N_4$, $SiO_2$, etc., using suitable deposition techniques, such as chemical vapor deposition (CVD), atomic layer deposition (ALD), plasma-enhanced chemical vapor deposition (PECVD), sputtering, etc. The dielectric layer may be patterned to create one or more vias. One or more suitable metallic materials may be deposited in the vias and patterned to fabricated one or more metal vias and/or metal pads.

FIGS. 9A-9E are diagrams illustrating I-V characteristics of example RRAM devices that are of varying device sizes and fabricated under the same annealing conditions.

Figure 9A:
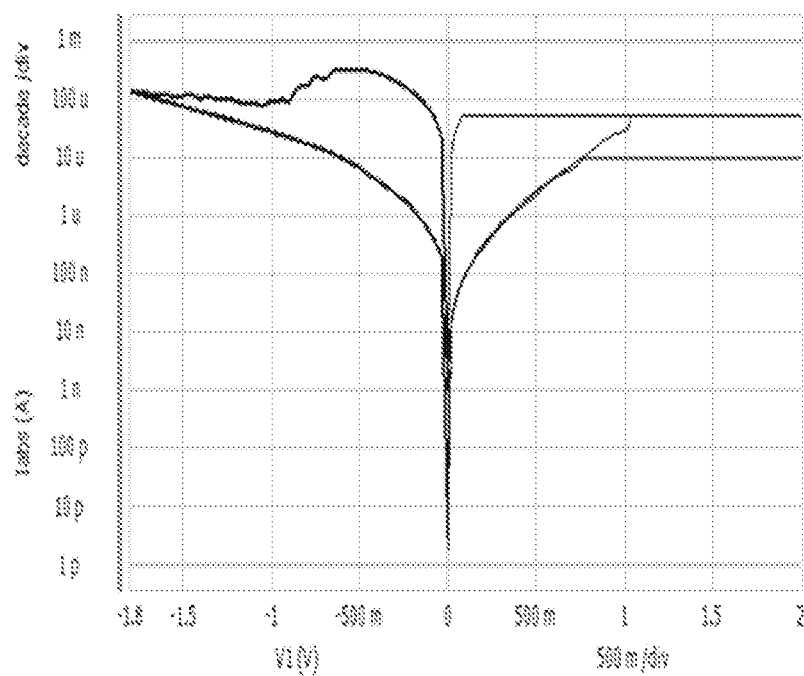
FIGS. 9A-9E include diagrams illustrating I-V characteristics of example RRAM devices that are of varying device sizes and fabricated under the same annealing conditions.
Figure 9A:
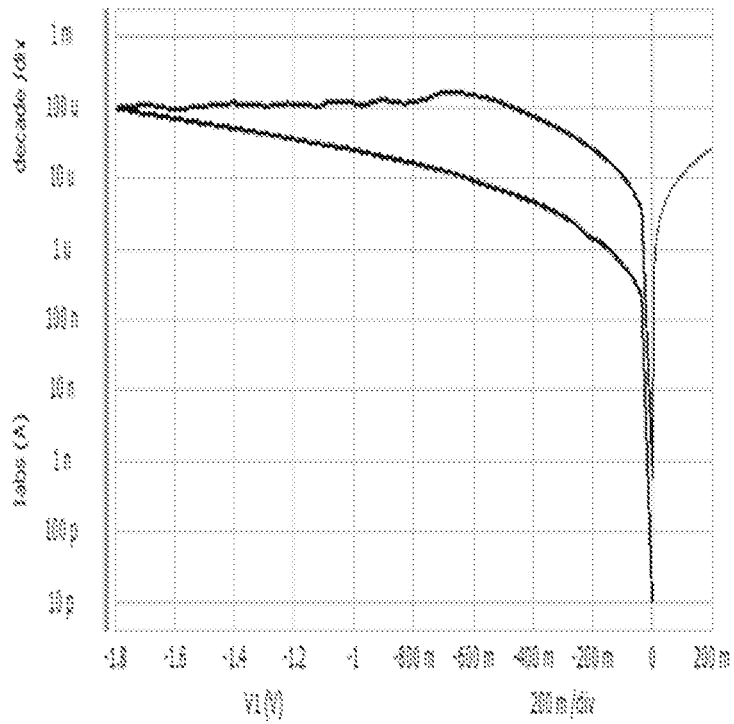
Figure 9B:
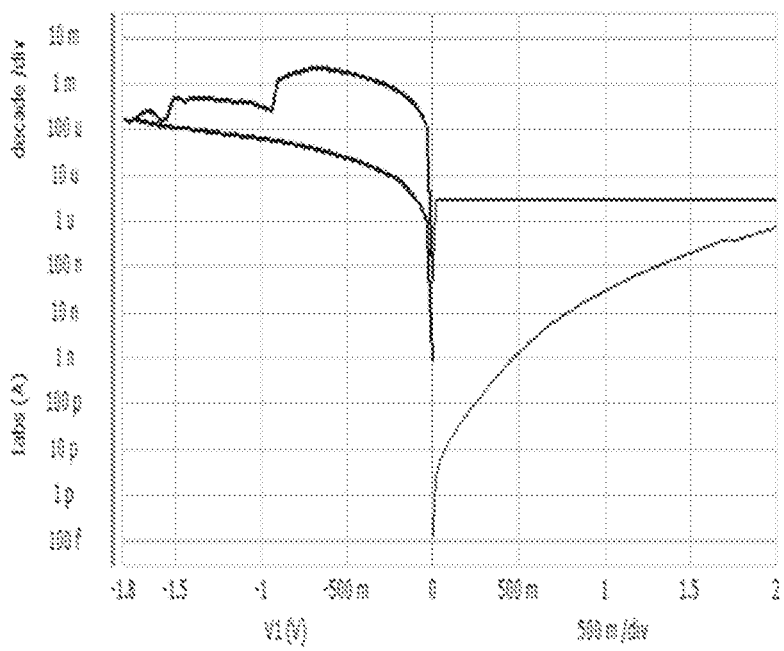
Figure 9B:
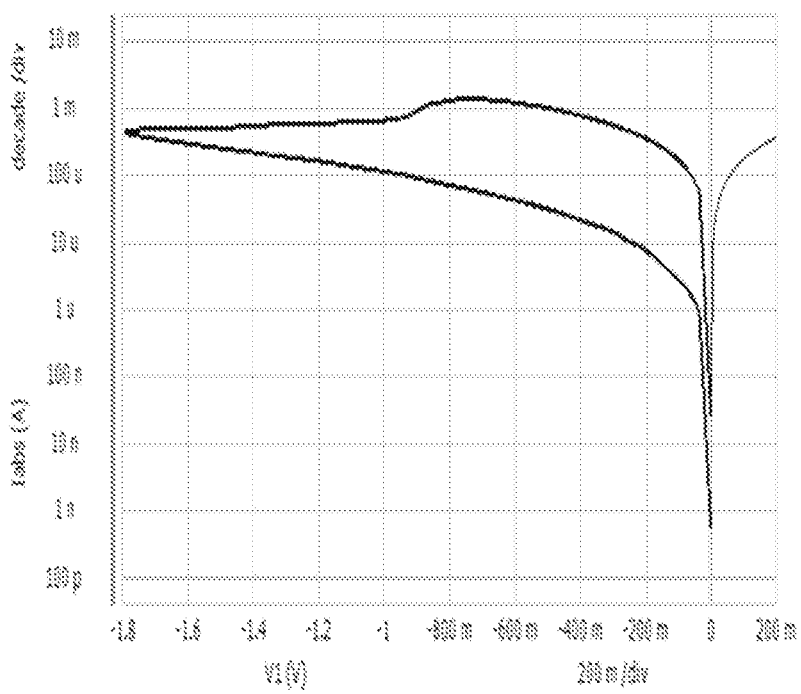
Figure 9C:
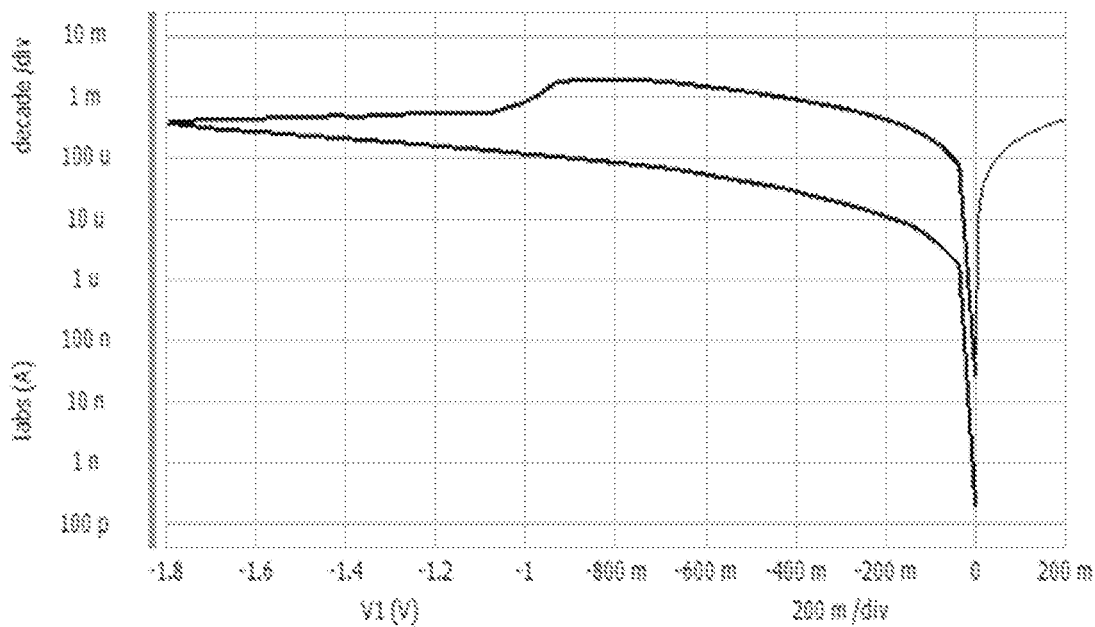
Figure 9C:
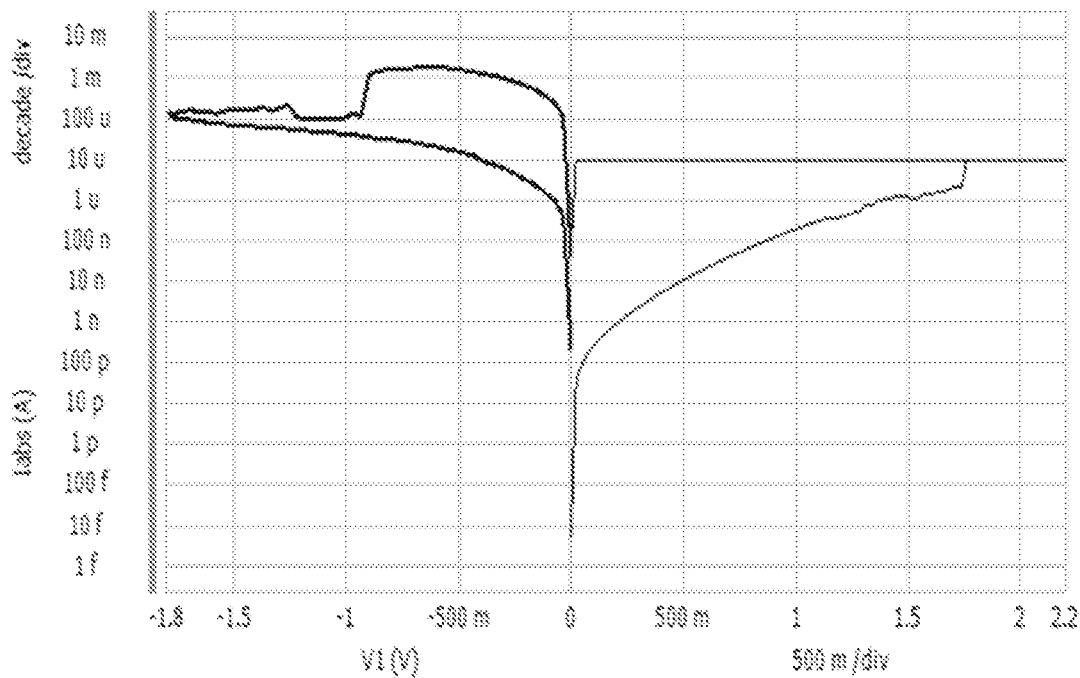
Figure 9D:
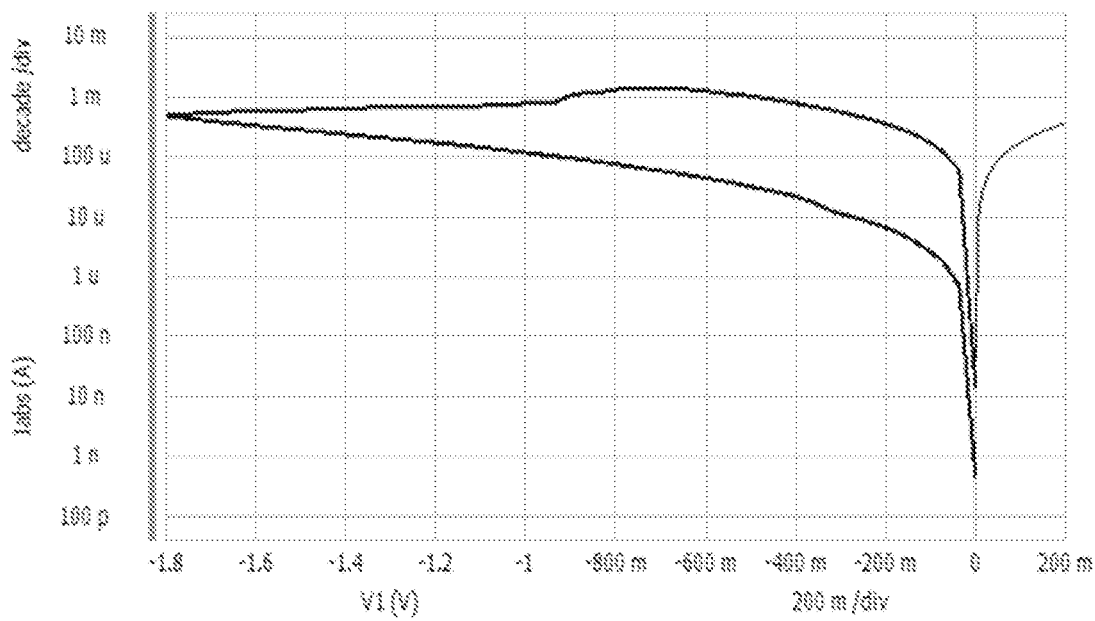
Figure 9D:
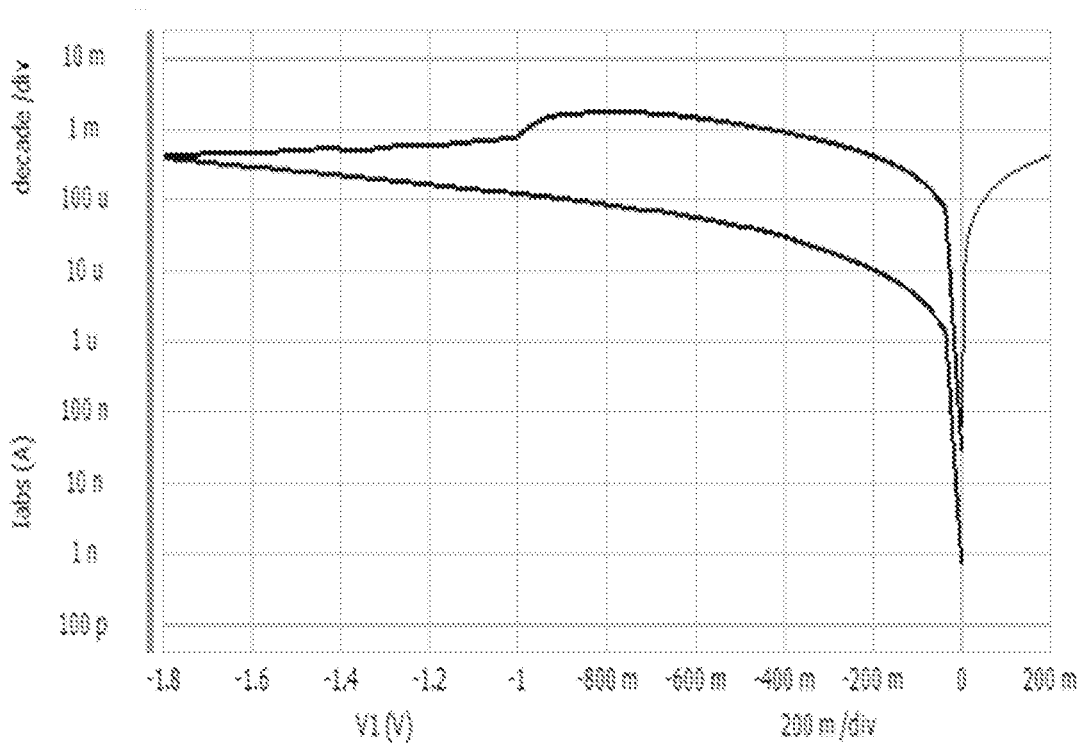
Figure 9E:
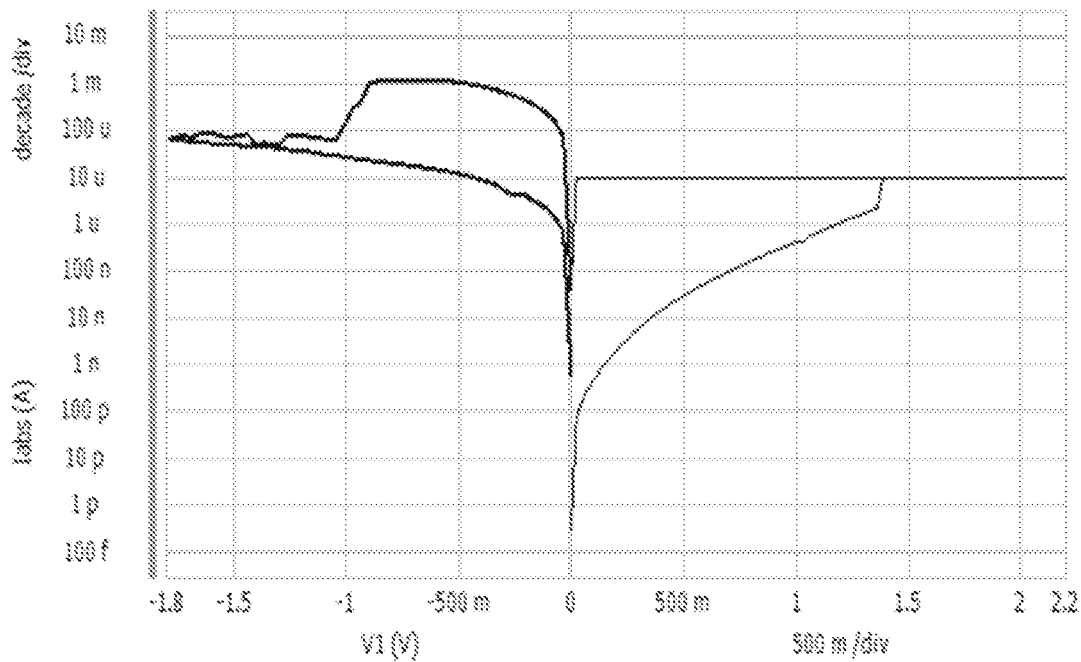
Figure 9F:
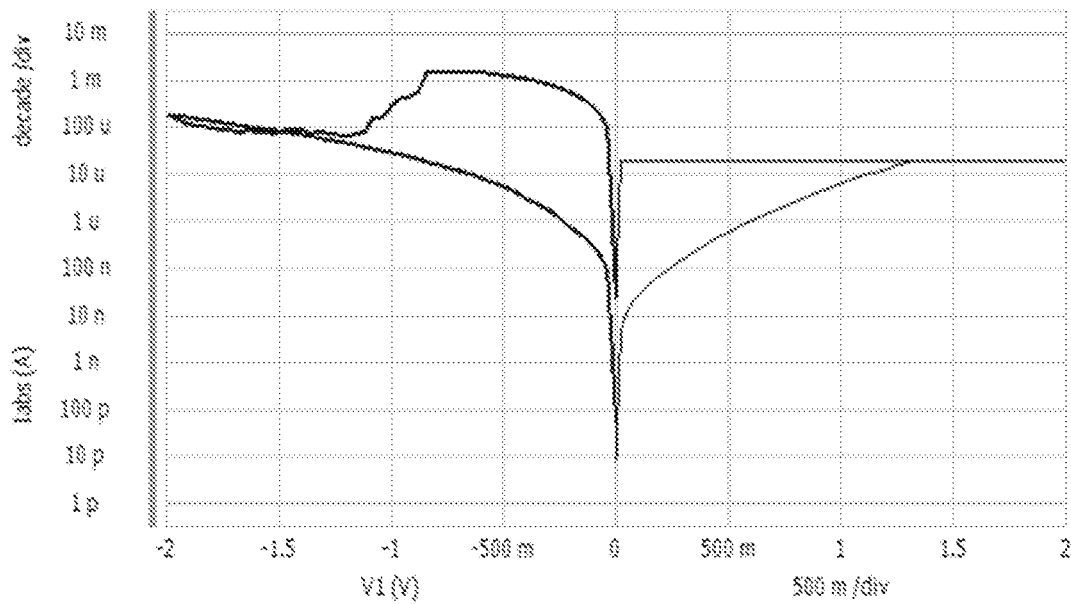
FIG. 9F-9J includes diagrams illustrating I-V characteristics of example RRAM devices that are of the same device size and fabricated under varying annealing conditions.
Figure 9G:
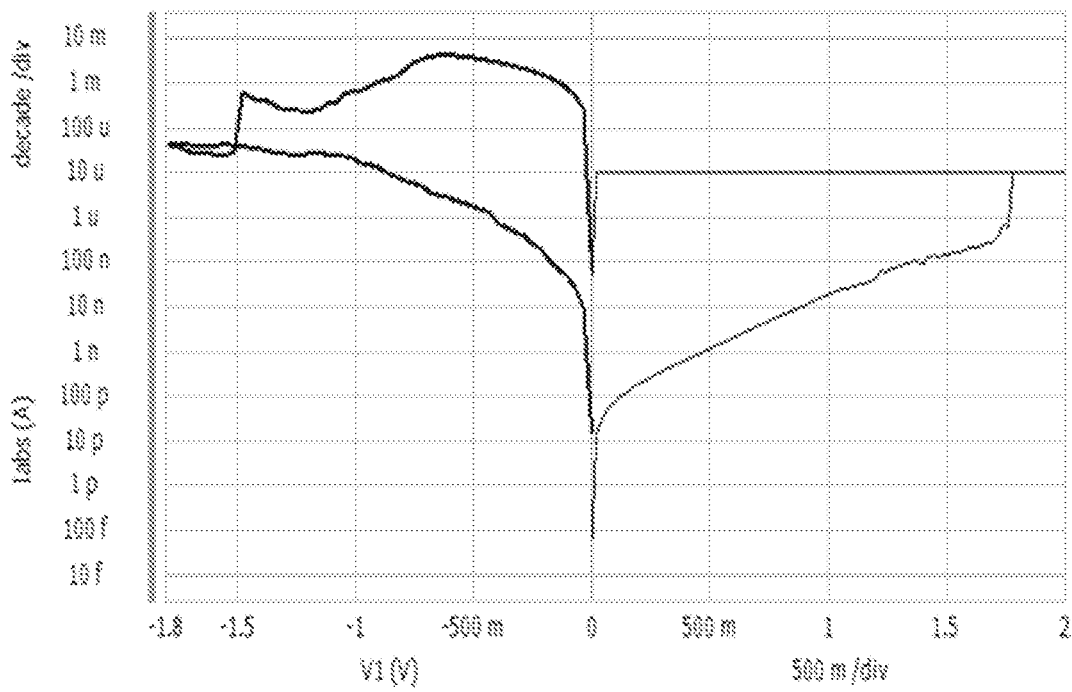
Figure 9G:
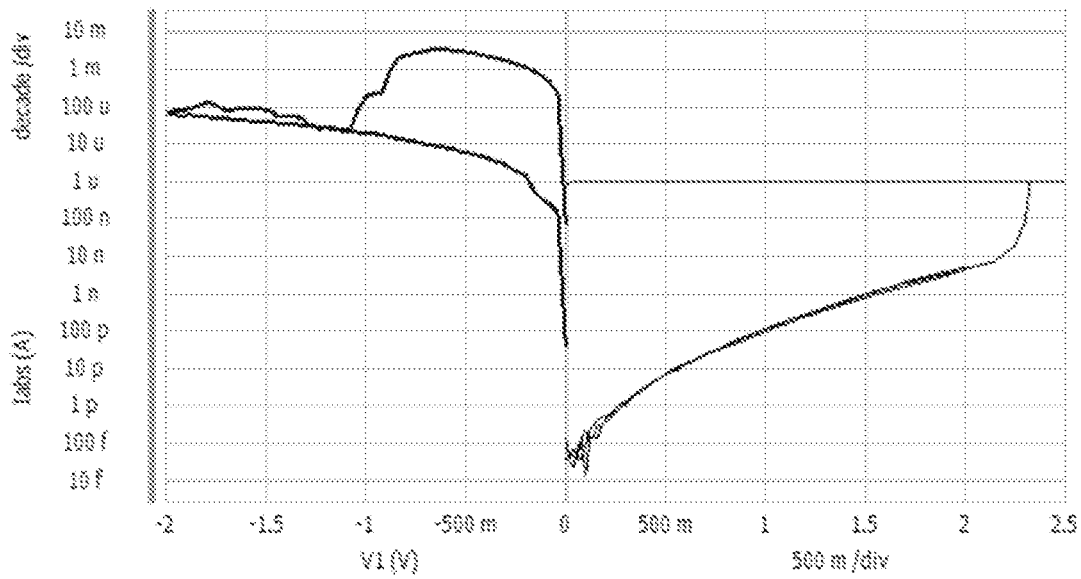
Figure 9H:
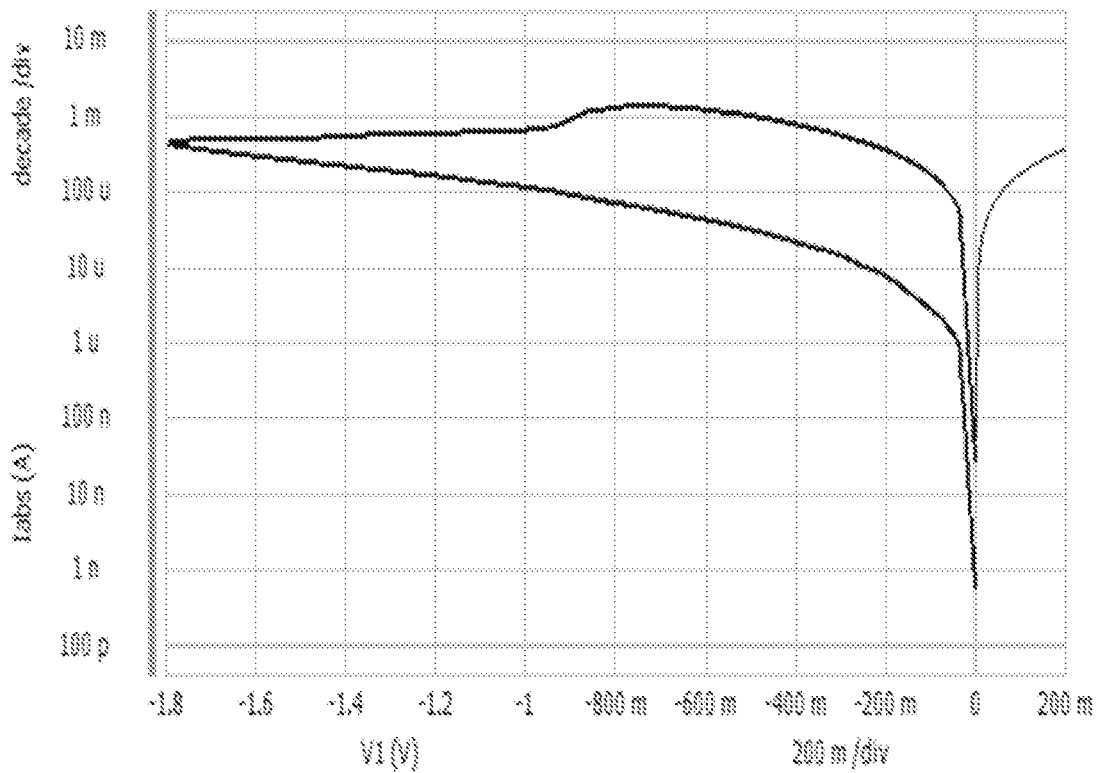
Figure 9H:
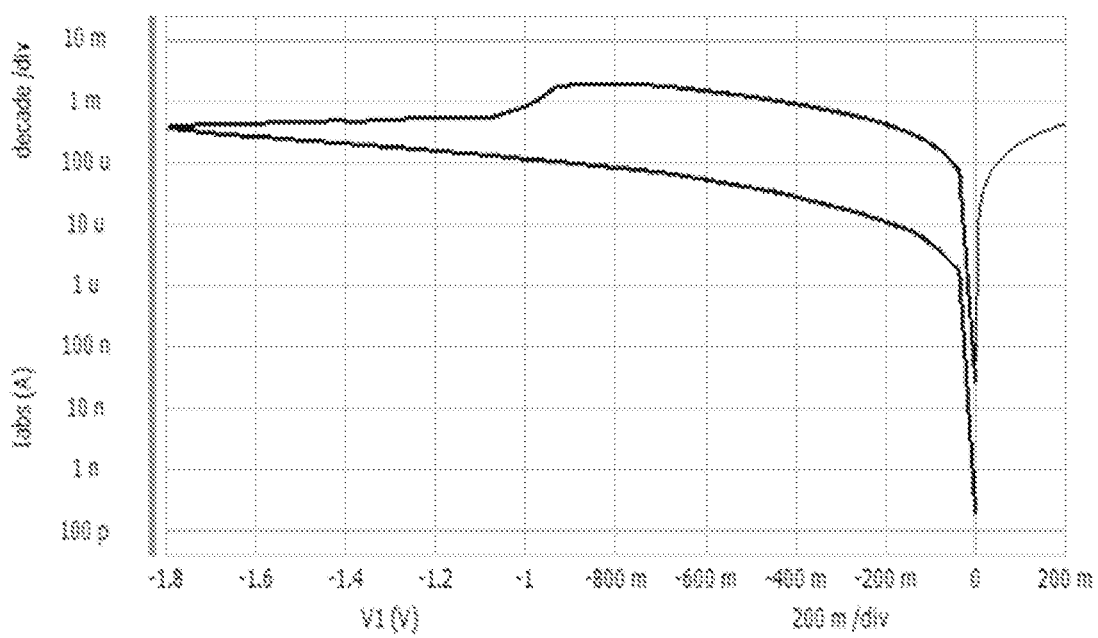
Figure 9I:
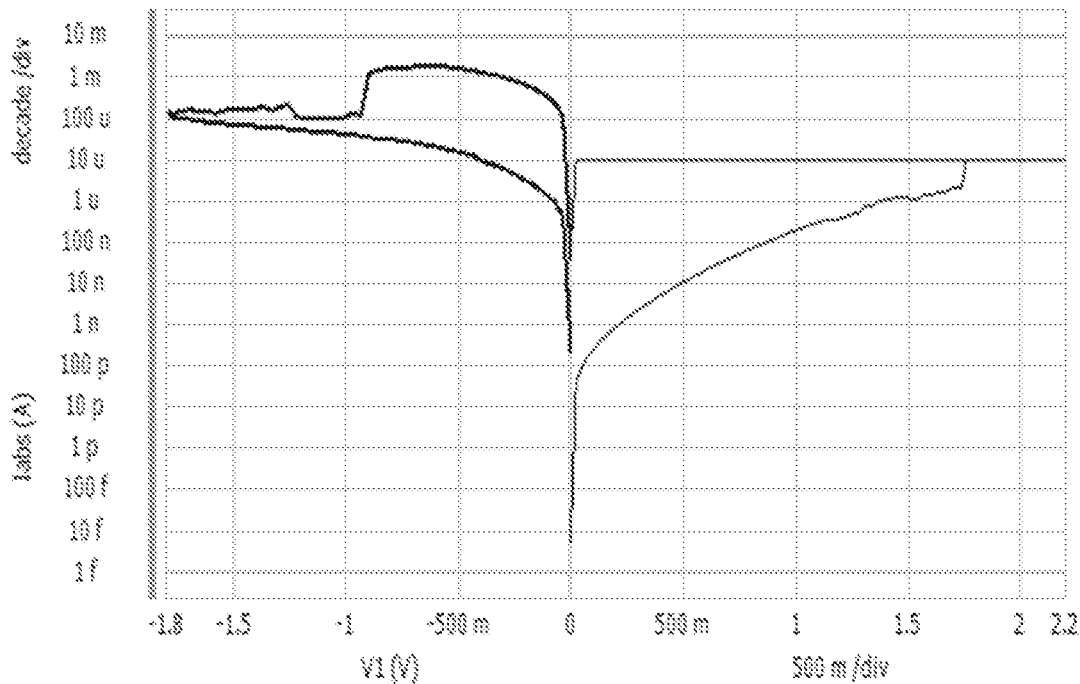
Figure 9I:
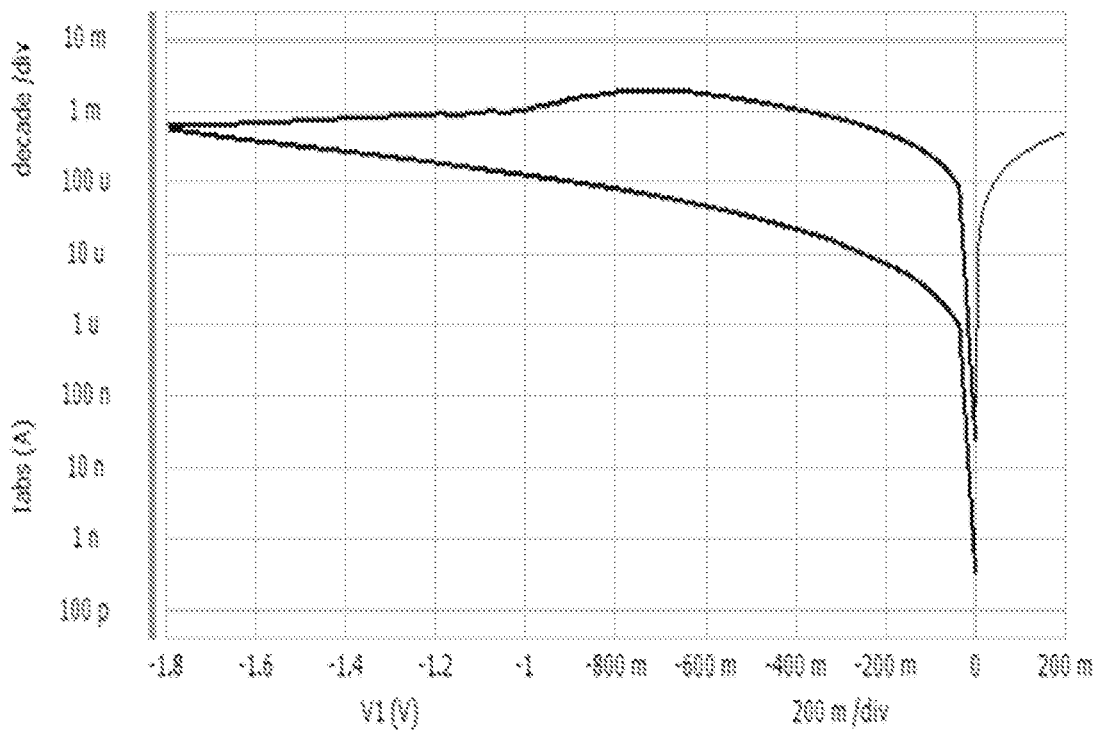
Figure 9J:
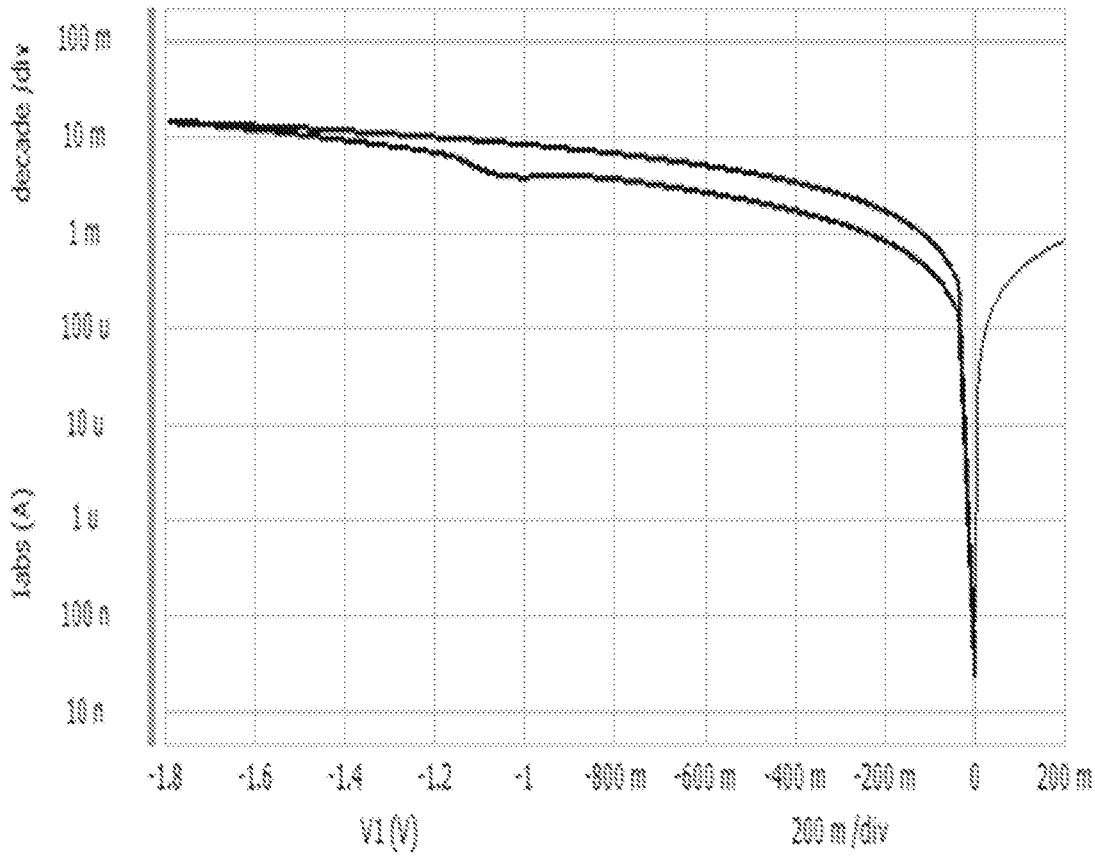
Figure 9J:
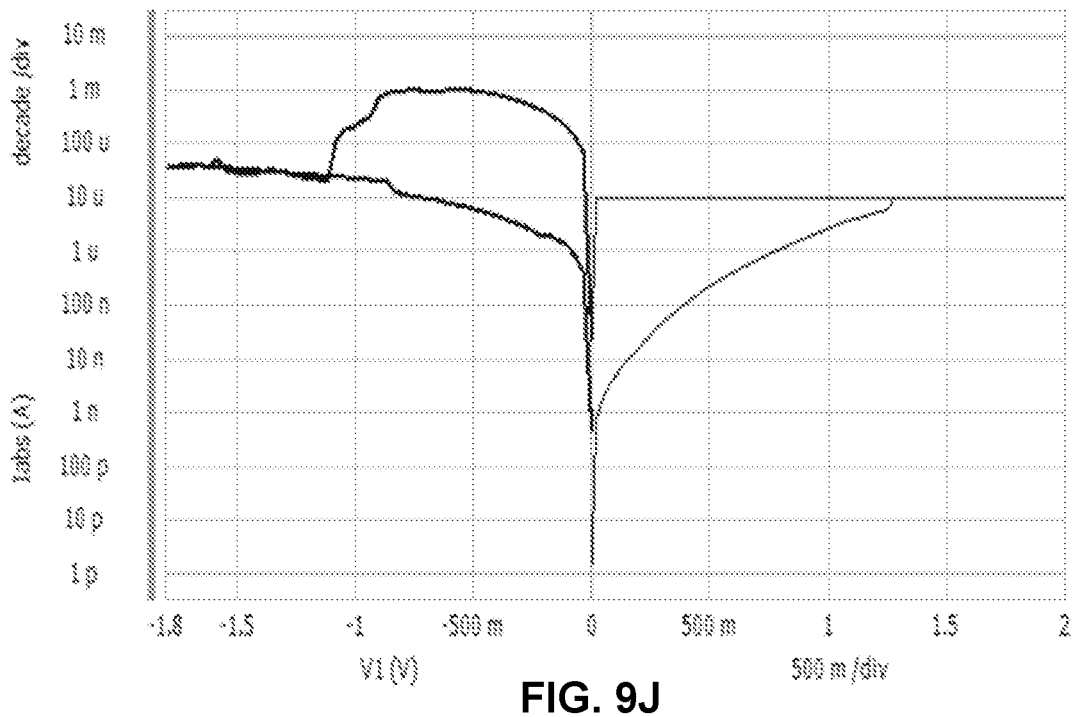

I-V curves 911, 913, and 915 show I-V characteristics of RRAM devices that have a critical dimension of 0.18 μm. I-V curves 921, 923, and 925 show I-V characteristics of RRAM devices with a critical dimension of 0.24 μm. I-V curves 931, 933, and 935 show I-V characteristics of RRAM devices with a critical dimension of 0.28 μm. The RRAM devices corresponding to I-V curves 911, 921, and 931 do not include an interface layer. Each of the RRAM devices corresponding to I-V curves 913, 923, and 933 includes a thin interface layer (e.g., a layer of 0.2 nm-0.6 nm). In some embodiments, the think interface layer may be and/or include a discontinuous layer. Each of the RRAM devices corresponding to I-V curves 915, 925, and 935 includes a thick interface layer (e.g., a layer that is about or greater than 1 nm). The RRAM devices exhibit varying resistances as shown in FIG. 9A. The RRAM devices corresponding to I-V curves 921, 931, 913, 923, and 933 are forming-free RRAM devices with a virgin resistance of about 549 Ω, 543 Ω, 7.5 kΩ, 465 Ω, and 460 Ω, respectively.

FIGS. 9F-9J are diagrams illustrating I-V characteristics of example RRAM devices of the same device size (e.g., a critical dimension of 0.24 μm) that are fabricated under varying annealing conditions.

The RRAM devices corresponding to I-V curves 941, 943, and 945 are fabricated without annealing. The RRAM devices corresponding to I-V curves 951, 953, and 955 are fabricated under short annealing. The RRAM device corresponding to I-V curves 961, 963, and 965 are fabricated under long annealing. Each of the RRAM devices corresponding to I-V curves 941, 951, and 961 includes no interface layer. Each of the RRAM devices corresponding to I-V curves 943, 953, and 963 includes a thin interface layer (e.g., a layer of 0.2 nm-0.6 nm). In some embodiments, the think interface layer may be and/or include a discontinuous layer. Each of the RRAM devices corresponding to I-V curves 945, 955, and 965 includes a thick interface layer (e.g., a layer that is about or greater than 1 nm). The RRAM devices corresponding to I-V curves 951, 953, 961, and 963 are forming-free RRAM devices as described herein with a virgin resistance of about 549 Ω, 460 Ω, 389 Ω, and 239 Ω, respectively. According to FIGS. 9A-9B, the annealing conditions and the thickness of the interface layer may be optimized in view of the device size to achieve a desirable virgin resistance.

Figure 10:
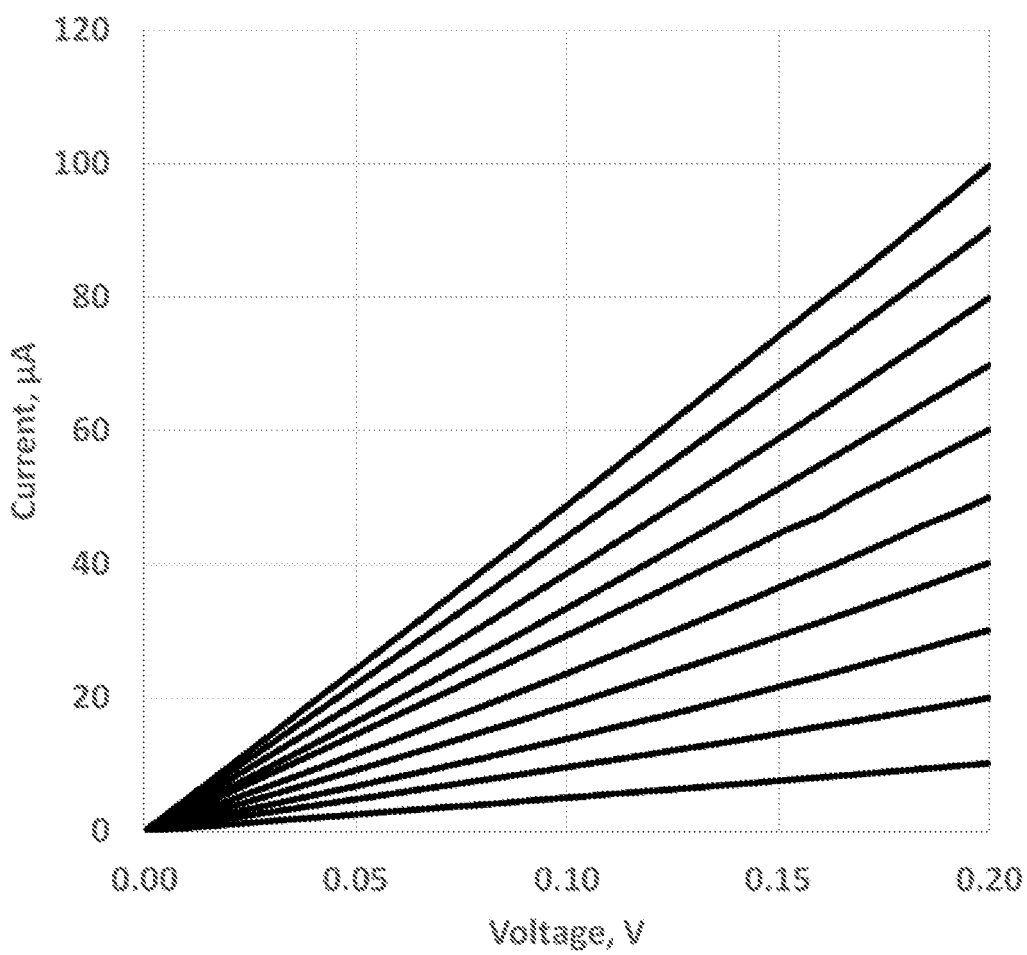
FIG. 10 is an I-V curve showing the analog behavior of an example forming-free RRAM device in accordance with some embodiments of the present disclosure.

FIG. 10 is an I-V curve showing the analog behavior of an example forming-free RRAM device in accordance with some embodiments of the present disclosure. As shown, the forming-free RRAM device presents desirable analog behavior that the device resistance can be tuned to multiple levels (or analog behavior) without a forming process by controlling the current compliance, and the current is linearly proportional to the voltage (or linearity behavior) at each resistance state.

Figure 11:
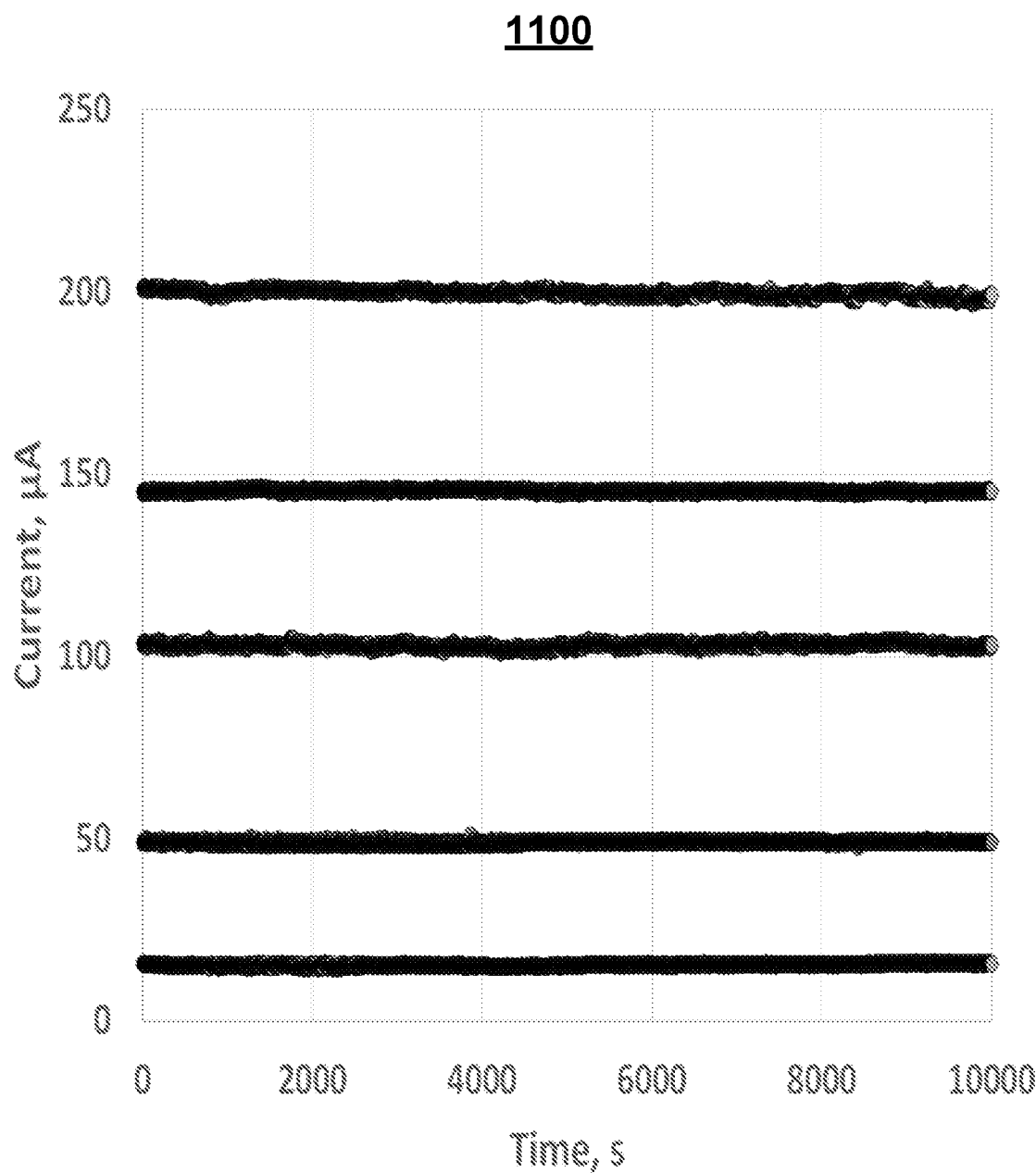
FIG. 11 is a diagram illustrating device read current characteristics of an example forming-free RRAM device over time in accordance with some embodiments of the present disclosure.

FIG. 11 is a diagram 1100 illustrating device read current characteristics of an example forming-free RRAM device over time in accordance with some embodiments of the present disclosure. Diagram 1100 illustrates the device read current characteristics of the example RRAM device at 135° C. Diagram 1100 may represent results of a device retention test for the forming-free RRAM device's capabilities to retain the resistance levels with time. Diagram 1100 may also represent results of a read stability test as the RRAM device is under constant reading (with a reading voltage of 0.2V) for its capabilities to retain the resistance levels with time.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method for fabricating a forming-free resistive random-access memory (RRAM) device, comprising:
fabricating an RRAM cell, comprising:
fabricating, on a bottom electrode, a switching oxide layer comprising at least one transition metal oxide;
fabricating, on the switching oxide layer, an interface layer comprising a material that is more chemically stable than the at least one transition metal oxide; and
fabricating a top electrode on the interface layer; and
annealing the RRAM cell.

2. The method of claim 1, wherein the RRAM cell is annealed in a forming gas environment comprising $N_2$ and $H_2$.

3. The method of claim 1, wherein the RRAM cell is annealed at an annealing temperature between about 350° C. and 450° C.

4. The method of claim 1, further comprising:
fabricating, on the RRAM cell, one or more interconnect layers, wherein the RRAM cell is annealed with the one or more interconnect layers.

5. The method of claim 4, wherein fabricating the one or more interconnect layers comprises fabricating, on the top electrode of the RRAM cell, a metal pad or a metal via of the one or more interconnect layers.

6. The method of claim 4, wherein the RRAM cell and the one or more interconnect layers are annealed in a plurality of annealing processes, and wherein the RRAM cell and the one or more interconnect layers are annealed in a forming gas at a temperature between about 350° C. and 450° C. in each of the plurality of annealing processes.

7. The method of claim 1, wherein a thickness of the interface layer is determined based on a device size of the RRAM cell and thermal budgets related to the annealing, wherein the interface layer is configured to reduce diffusion and reaction between the top electrode and the switching oxide layer.

8. A forming-free resistive random-access memory (RRAM) device, comprising:
- a bottom electrode;
- a switching oxide layer comprising at least one transition metal oxide;
- a top electrode; and
- an interface layer fabricated between the top electrode and the switching oxide layer, wherein the interface layer comprises a material that is more chemically stable than the at least one transition metal oxide, wherein the forming-free RRAM device is configured to be switched to a plurality of resistances without a forming process that generates a conductive filament in the switching oxide layer.

9. The forming-free RRAM device of claim 8, wherein the at least one transition metal oxide comprises at least one of $HfO_x$ or $TaO_y$, wherein $x \leq 2.0$, and wherein $y \leq 2.5$.

10. The forming-free RRAM device of claim 9, wherein the interface layer comprises a layer of at least one of $Al_2O_3$, MgO, $Y_2O_3$, or $La_2O_3$.

11. The forming-free RRAM device of claim 10, wherein a thickness of the interface layer is between 0.2 nm and 1 nm.

12. The forming-free RRAM device of claim 10, wherein a thickness of the interface layer is greater than 1 nm.

13. The forming-free RRAM device of claim 8, wherein a virgin resistance of the RRAM device is between 1 kΩ and 1 MΩ.

* * * * *